(12) United States Patent
Masuda et al.

(10) Patent No.: US 9,912,890 B2
(45) Date of Patent: Mar. 6, 2018

(54) SOLID-STATE IMAGING DEVICE AND METHOD FOR PRODUCING THE SAME, AND ELECTRONIC APPARATUS

(71) Applicant: SONY CORPORATION, Tokyo (JP)

(72) Inventors: Yoshiaki Masuda, Kumamoto (JP);
Kazufumi Watanabe, Kumamoto (JP);
Kyohei Mizuta, Kumamoto (JP);
Keishi Inoue, Kumamoto (JP);
Hirohisa Uchida, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 84 days.

(21) Appl. No.: 14/778,548

(22) PCT Filed: Mar. 12, 2014

(86) PCT No.: PCT/JP2014/056522
§ 371 (c)(1),
(2) Date: Sep. 18, 2015

(87) PCT Pub. No.: WO2014/156657
PCT Pub. Date: Oct. 2, 2014

(65) Prior Publication Data
US 2016/0301885 A1    Oct. 13, 2016

(30) Foreign Application Priority Data

Mar. 25, 2013  (JP) ................... 2013-062018
Oct. 24, 2013  (JP) ................... 2013-221094

(51) Int. Cl.
*H04N 5/374* (2011.01)
*H01L 27/146* (2006.01)

(52) U.S. Cl.
CPC ....... *H04N 5/374* (2013.01); *H01L 27/14603* (2013.01); *H01L 27/14607* (2013.01);
(Continued)

(58) Field of Classification Search
CPC ......... H01L 27/14636; H01L 27/14603; H01L 27/14689; H01L 27/14643; H01L 27/1464;
(Continued)

(56) References Cited

U.S. PATENT DOCUMENTS

2007/0120131 A1* 5/2007 Hasegawa ......... H01L 27/14632
257/79
2010/0233434 A1* 9/2010 Lahav ................... B82Y 10/00
428/156
(Continued)

FOREIGN PATENT DOCUMENTS

JP    5-299625 A    11/1993
JP    2008-270500 A    11/2008
(Continued)

*Primary Examiner* — Antoinette Spinks
(74) *Attorney, Agent, or Firm* — Chip Law Group

(57) ABSTRACT

Provided is a solid-state imaging device including: an effective pixel region of a substrate, effective pixels being arranged in the effective pixel region; an interconnection region around the effective pixel region, electrodes or interconnects being provided in the interconnection region; a peripheral region outside the interconnection region; and a film formed on the substrate. A cross-sectional height of the film in the effective pixel region is smaller than a cross-sectional height of the film in the interconnection region, and a cross-sectional height of the film in the peripheral region and a cross-sectional height of the film in at least a portion of a middle region between the effective pixel region and the interconnection region, the portion being closer to the interconnection region, are between the cross-sectional height of the film in the effective pixel region and the cross-sectional height of the film in the interconnection region.

23 Claims, 34 Drawing Sheets

(52) U.S. Cl.
CPC .. *H01L 27/14621* (2013.01); *H01L 27/14623* (2013.01); *H01L 27/14636* (2013.01); *H01L 27/14643* (2013.01); *H01L 27/14685* (2013.01); *H01L 27/14689* (2013.01); *H01L 27/1464* (2013.01)

(58) Field of Classification Search
CPC ......... H01L 27/14621; H01L 27/14623; H01L 27/14685; H01L 27/14607; H04N 5/374
USPC .......................................................... 348/308
See application file for complete search history.

(56) References Cited

U.S. PATENT DOCUMENTS

| | | | | |
|---|---|---|---|---|
| 2010/0244029 | A1* | 9/2010 | Yamazaki | H01L 27/1225 257/52 |
| 2010/0288911 | A1* | 11/2010 | Mizuta | H01L 27/14632 250/208.1 |
| 2011/0241151 | A1* | 10/2011 | Nakatani | H01L 27/307 257/443 |
| 2014/0353661 | A1* | 12/2014 | Seo | H01L 27/3279 257/43 |
| 2015/0280155 | A1* | 10/2015 | Tamaki | H01L 51/441 257/40 |

FOREIGN PATENT DOCUMENTS

| | | |
|---|---|---|
| JP | 2009-267062 A | 11/2009 |
| JP | 2010-267675 A | 11/2010 |
| JP | 2011-096851 A | 5/2011 |

\* cited by examiner

SOLID-STATE IMAGING DEVICE AND METHOD FOR PRODUCING THE SAME, AND ELECTRONIC APPARATUS

TECHNICAL FIELD

The present technology relates to solid-state imaging devices and methods for producing a solid-state imaging device, and electronic apparatuses. More particularly, the present technology relates to a solid-state imaging device that can reduce uneven application of an organic material and a method for producing the solid-state imaging device, and an electronic apparatus.

BACKGROUND ART

A back-illuminated solid-state imaging device having a three-dimensional structure has in recent years been proposed in which a circuit substrate on which a drive circuit is formed is attached to an opposite surface from a light receiving surface of a semiconductor substrate on which pixels including a photoelectric conversion unit are formed (see, for example, Patent Literature 1). Such a solid-state imaging device having a three-dimensional structure includes a connection electrode for electrically connecting the semiconductor substrate and the circuit substrate together.

FIG. 1 is a cross-sectional view showing an example configuration of a conventional back-illuminated solid-state imaging device having a three-dimensional structure.

In FIG. 1, a circuit substrate 11 and a semiconductor substrate 12 are attached together, and are electrically connected together by a connection electrode 13. Also, an insulating film 14 is formed on a light receiving surface side (an upper side in FIG. 1) of the semiconductor substrate 12.

In the solid-state imaging device shown in FIG. 1, the insulating film 14 is formed so that the height of a cross-section (hereinafter also referred to as a "cross-sectional height") of a pixel region where a plurality of pixels are provided, and the height of a cross-section of a peripheral region which is outside an interconnection region where the connection electrode 13 is provided, are smaller than the height of a cross-section of the interconnection region. By thus reducing the profile of the pixel region, sensitivity characteristics or color mixture characteristics can be improved. Also, by reducing the profile of the pixel region, constraints on the arrangement of circuit interconnects or alignment marks in the peripheral region can be relaxed, and stress on the substrate can be reduced.

CITATION LIST

Patent Literature

Patent Literature 1: JP 2011-96851A

SUMMARY OF INVENTION

Technical Problem

However, when an organic material, such as a color filter (CF) material or the like, is applied to the solid-state imaging device shown in FIG. 1, uneven application of the organic material may occur due to a difference in height between the peripheral region and the interconnection region or a difference in height between the interconnection region and the pixel region.

With such circumstances in mind, the present technology has been made to reduce uneven application of the organic material.

Solution to Problem

According to a first aspect of the present technology, there is provided a solid-state imaging device including: an effective pixel region of a substrate, effective pixels being arranged in the effective pixel region; an interconnection region around the effective pixel region, electrodes or interconnects being provided in the interconnection region; a peripheral region outside the interconnection region; and a film formed on the substrate. A cross-sectional height of the film in the effective pixel region is smaller than a cross-sectional height of the film in the interconnection region, and a cross-sectional height of the film in the peripheral region and a cross-sectional height of the film in at least a portion of a middle region between the effective pixel region and the interconnection region, the portion being closer to the interconnection region, are between the cross-sectional height of the film in the effective pixel region and the cross-sectional height of the film in the interconnection region.

A step portion of the film in the middle region can be closer to the effective pixel region than a center of a width of the middle region is.

A step portion of the film in the middle region can be closer to the interconnection region than a center of a width of the middle region is.

Plan-view shapes of a step portion of the film in the middle region, a step portion between the middle region and the interconnection region, and/or a step portion between the interconnection region and the peripheral region can have at least one corner portion having a round corner shape or a beveled shape.

In an adjacent region on the film adjacent to the interconnection region, a height adjustment member that causes the adjacent region to have generally a same cross-sectional height as the interconnection region can be formed.

The height adjustment member can be formed in the adjacent region in the peripheral region and/or the middle region.

When a plan-view shape of the interconnection region has at least one gap, the height adjustment member can be formed to connect the gap.

The height adjustment member can cause the adjacent region to have a cross-sectional height that is generally same as or greater than or equal to the cross-sectional height of the interconnection region, and cause a region including at least the interconnection region to have a cross-sectional height greater than the cross-sectional height of the adjacent region.

A plan-view shape of the height adjustment member can have at least one corner portion having a round corner shape or a beveled shape.

A recessed portion having a cross-sectional height smaller than the cross-sectional height of the effective pixel region can be formed in a region of the film in the middle region, the region having a same cross-sectional height as the effective pixel region.

A recessed portion having a same cross-sectional height as the effective pixel region can be formed in a region of the film in the middle region, the region having a same cross-sectional height as the peripheral region.

A light shield film having an opening corresponding to a photoelectric conversion unit of each of the effective pixels in the effective pixel region can be further included. The cross-sectional height of the film in the effective pixel region can be smaller than a cross-sectional height of the light shield film.

According to the first aspect of the present technology, there is provided a method for producing a solid-state imaging device, the solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, the method including: a step of causing a cross-sectional height of the film in the effective pixel region to be smaller than a cross-sectional height of the film in the interconnection region, and causing a cross-sectional height of the film in the peripheral region and a cross-sectional height of the film in at least a portion of a middle region between the effective pixel region and the interconnection region, the portion being closer to the interconnection region, to be between the cross-sectional height of the film in the effective pixel region and the cross-sectional height of the film in the interconnection region.

According to the first aspect of the present technology, there is provided an electronic apparatus including: a solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, in which a cross-sectional height of the film in the effective pixel region is smaller than a cross-sectional height of the film in the interconnection region, and a cross-sectional height of the film in the peripheral region and a cross-sectional height of the film in at least a portion of a middle region between the effective pixel region and the interconnection region, the portion being closer to the interconnection region, are between the cross-sectional height of the film in the effective pixel region and the cross-sectional height of the film in the interconnection region; and a signal processing circuit that processes an output signal output from the solid-state imaging device.

According to the first aspect of the present technology, the cross-sectional height of the film formed on the substrate in the effective pixel region is smaller than the cross-sectional height of the film in the interconnection region, and the cross-sectional height of the film in the peripheral region and the cross-sectional height of the film in at least a portion of the middle region between the effective pixel region and the interconnection region, the portion being closer to the interconnection region, are between the cross-sectional height of the film in the effective pixel region and the cross-sectional height of the film in the interconnection region.

According to a second aspect of the present technology, there is provided a solid-state imaging device including: an effective pixel region of a substrate, effective pixels being arranged in the effective pixel region; an interconnection region around the effective pixel region, electrodes or interconnects being provided in the interconnection region; a peripheral region outside the interconnection region; and a film formed on the substrate. Cross-sectional heights of the film in the effective pixel region and the peripheral region are smaller than a cross-sectional height of the film in the interconnection region. In an adjacent region on the film adjacent to the interconnection region, formed is a height adjustment member that causes the adjacent region to have generally a same cross-sectional height as the interconnection region.

The height adjustment member can be formed in the adjacent region in the peripheral region and/or the effective pixel region.

When a plan-view shape of the interconnection region has at least one gap, the height adjustment member can be formed to connect the gap.

The height adjustment member can cause the adjacent region to have a cross-sectional height that is generally same as or greater than or equal to the cross-sectional height of the interconnection region, and cause a region including at least the interconnection region to have a cross-sectional height greater than the cross-sectional height of the adjacent region.

A plan-view shape of the height adjustment member can have at least one corner portion having a round corner shape or a beveled shape.

A recessed portion having a cross-sectional height smaller than the cross-sectional height of the effective pixel region can be formed in a middle region of the film between the effective pixel region and the interconnection region.

A light shield film having an opening corresponding to a photoelectric conversion unit of each of the effective pixels in the effective pixel region can be further included. The cross-sectional height of the film in the effective pixel region can be smaller than a cross-sectional height of the light shield film.

According to the second aspect of the present technology, there is provided a method for producing a solid-state imaging device, the solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, the method including: a step of causing cross-sectional heights of the film in the effective pixel region and the peripheral region to be smaller than a cross-sectional height of the film in the interconnection region; and a step of forming, in an adjacent region on the film adjacent to the interconnection region, a height adjustment member that causes the adjacent region to have generally a same cross-sectional height as the interconnection region.

According to the second aspect of the present technology, there is provided an electronic apparatus including: a solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, in which cross-sectional heights of the film in the effective pixel region and the peripheral region are smaller than a cross-sectional height of the film in the interconnection region, and in which, in an adjacent region on the film adjacent to the interconnection region, formed is a height adjustment member that causes the adjacent region to have generally a same cross-sectional height as the interconnection region; and a signal processing circuit that processes an output signal output from the solid-state imaging device.

According to the second aspect of the present technology, the cross-sectional heights of the film formed on the substrate in the effective pixel region and the peripheral region are smaller than the cross-sectional height of the film in the interconnection region. In an adjacent region on the film adjacent to the interconnection region, formed is a height adjustment member that causes the adjacent region to have generally the same cross-sectional height as the interconnection region.

Advantageous Effects of Invention

According to the first and second aspects of the present technology, uneven application of the organic material can be reduced.

DESCRIPTION OF EMBODIMENTS

Embodiments of the present technology will now be described with reference to the drawings. Note that description will be provided in the following order.

1. First embodiment (formation of a plurality of cross-sectional heights)

2. Second embodiment (formation of height adjustment member)

3. Third embodiment (formation of recessed portion)

4. Fourth embodiment (reduction of thickness of insulating film)

5. Fifth embodiment (front-illuminated solid-state imaging device)

6. Sixth embodiment (electronic apparatus)

1. First Embodiment (Example Configuration of Solid-State Imaging Device)

Figure 2:
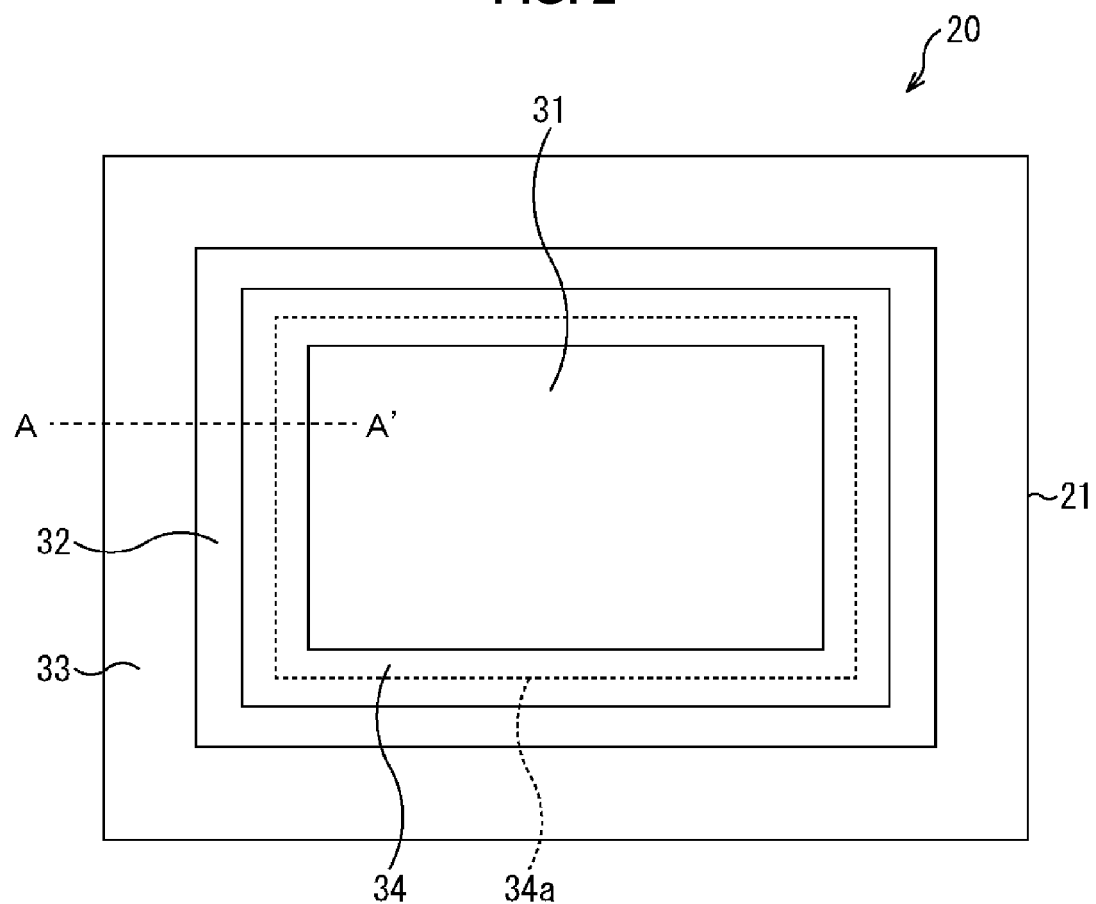
FIG. 2 is a plan view showing an example configuration of a solid-state imaging device of a first embodiment of the present technology.

FIG. 2 is a plan view showing an example configuration of a solid-state imaging device of a first embodiment of the present technology.

The solid-state imaging device 20 of FIG. 2 is a back-illuminated complementary metal oxide semiconductor (CMOS) image sensor having a three-dimensional structure that includes a sensor substrate 21 on which a plurality of pixels are formed, and a circuit substrate (not shown) attached to the sensor substrate 21 while the circuit substrate is put on top of the sensor substrate 21. Note that the solid-state imaging device 20 may be a front-illuminated CMOS image sensor or a charge coupled device (CCD) image sensor.

One surface of the sensor substrate 21 is a light receiving surface. In the light receiving surface, provided is an effective pixel region 31 where effective pixels used to obtain a captured image are two-dimensionally arranged in a matrix. Each effective pixel has a pixel circuit including a photoelectric conversion unit, a charge accumulation unit, a plurality of transistors, a capacitor, and the like. A portion of the pixel circuit is provided on a front surface which is on the opposite side from the light receiving surface of the sensor substrate. Note that a plurality of pixels may share a portion of the pixel circuit.

Also, the sensor substrate 21 includes, around the effective pixel region 31, an interconnection region 32 where a connection electrode that electrically connects the sensor substrate 21 and the circuit substrate together, and interconnects connected to the connection electrode, are provided, and further includes a peripheral region 33 outside the interconnection region 32. In this embodiment, the interconnection region 32 is formed in the shape of a rectangle surrounding the separate rectangular effective pixel region 31.

Note that, in the sensor substrate 21, an optically black pixel (OPB pixel) that is used to obtain a black level is provided in a middle region 34 interposed between the effective pixel region 31 and the interconnection region 32. Also, a step portion 34a that is a boundary between different cross-sectional heights is formed in the middle region 34.

(Cross-Sectional View of Solid-State Imaging Device)

Figure 3:
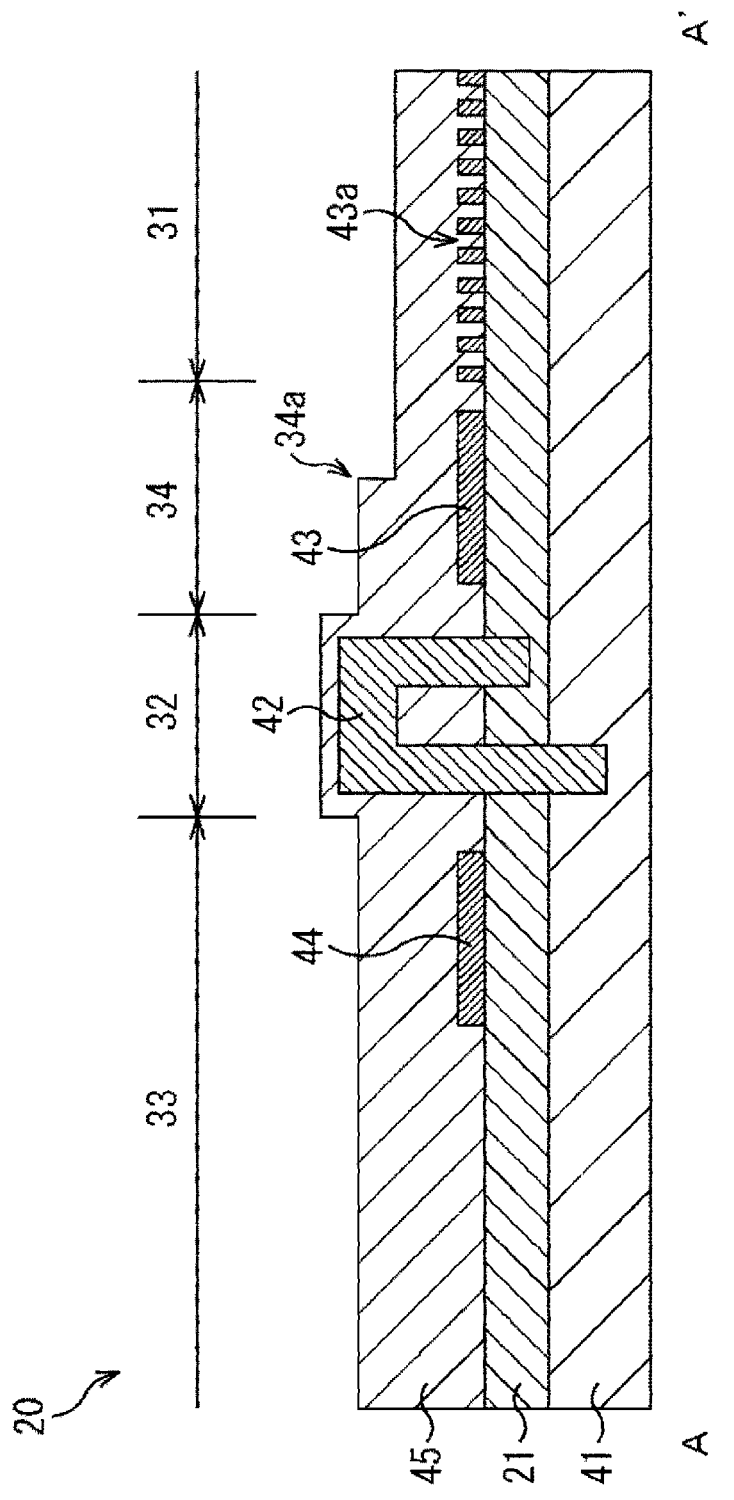
FIG. 3 is a cross-sectional view showing an example configuration of a solid-state imaging device of a first embodiment of the present technology.

FIG. 3 is a cross-sectional view showing the solid-state imaging device 20, taken along line A-A' of FIG. 2. Note that the solid-state imaging device 20 of FIG. 3 is in a state during the production process, specifically, in a state before application of a color filter (CF).

The solid-state imaging device 20 of FIG. 3 includes the sensor substrate 21, a circuit substrate 41 attached to an opposite surface of the sensor substrate 21 from the light receiving surface, a through-via 42 serving as a connection electrode that electrically connects the sensor substrate 21 and the circuit substrate 41 together, and an interconnect (not shown) connected to the through-via 42.

The sensor substrate 21 includes effective pixels that are two-dimensionally arranged in a matrix in the effective pixel region 31, and OPB pixels in the middle region 34.

The circuit substrate 41 includes a drive circuit for driving each pixel provided on the sensor substrate 21. The drive circuit is connected to a pixel circuit included in each pixel provided on the sensor substrate 21 through the through-via 42.

Also, a light shield film 43 is formed of, for example, tungsten (W) on the sensor substrate 21 in the effective pixel region 31 and the middle region 34. The light shield film 43 has a plurality of openings 43a that are provided in regions of the effective pixel region 31 where the photoelectric conversion units of the respective effective pixels are formed to block light between adjacent pixels. A peripheral circuit 44 including electrode pads and interconnects is provided on the sensor substrate 21 in the peripheral region 33.

Moreover, an insulating film 45 is formed of, for example, silicon oxide ($SiO_2$) on the light receiving surface side of the sensor substrate 21 so that the through-via 42, the light shield film 43, and the peripheral circuit 44 are buried in the insulating film 45.

The insulating film 45 is thickest in the interconnection region 32, is second thickest in the peripheral region 33 and a region of the middle region 34 closer to the interconnection region 32 than is the step portion 34a, and is thinnest in a region of the middle region 34 closer to the effective pixel region 31 than is the step portion 34a, and the effective pixel region 31. Specifically, in the solid-state imaging device 20 of FIG. 3, a cross-sectional height of the insulating film 45 in the effective pixel region 31 is smaller than a cross-sectional height of the insulating film 45 in the interconnection region 32, and cross-sectional heights of the insulating film 45 in the peripheral region 33 and the region of the middle region 34 closer to the interconnection region 32 than is the step portion 34a are between the cross-sectional height of the insulating film 45 in the effective pixel region 31 and the cross-sectional height of the insulating film 45 in the interconnection region 32.

According to the above structure, a difference in height between the peripheral region 33 and the interconnection region 32 is reduced, and multiple steps are provided between the interconnection region 32 and the effective pixel region 31, and therefore, fluid pressure that occurs at the steps during application of an organic material, such as a CF material or the like, is reduced. This can reduce uneven application, and therefore, the applied organic material can be caused to have a uniform thickness.

Note that the step portion 34a is located in the middle region 34 at a position between a width of the middle region 34, i.e., between an end of the effective pixel region 31 closer to the interconnection region 32 and an end of the interconnection region 32 closer to the effective pixel region 31. Here, there is a trade-off relationship between the reduction of uneven application of the organic material and the reduction of an uneven frame or shading of a captured image, and this relationship depends on the position of the step portion 34a in the middle region 34.

Specifically, if the step portion 34a in the middle region 34 is closer to the effective pixel region 31 than the center of the width of the middle region 34 is, uneven application of the organic material is further reduced. On the other hand, if the step portion 34a in the middle region 34 is closer to the interconnection region 32 than the center of the width of the middle region 34 is, an uneven frame or shading is further reduced.

(Process of Producing Solid-State Imaging Device)

Figure 4:
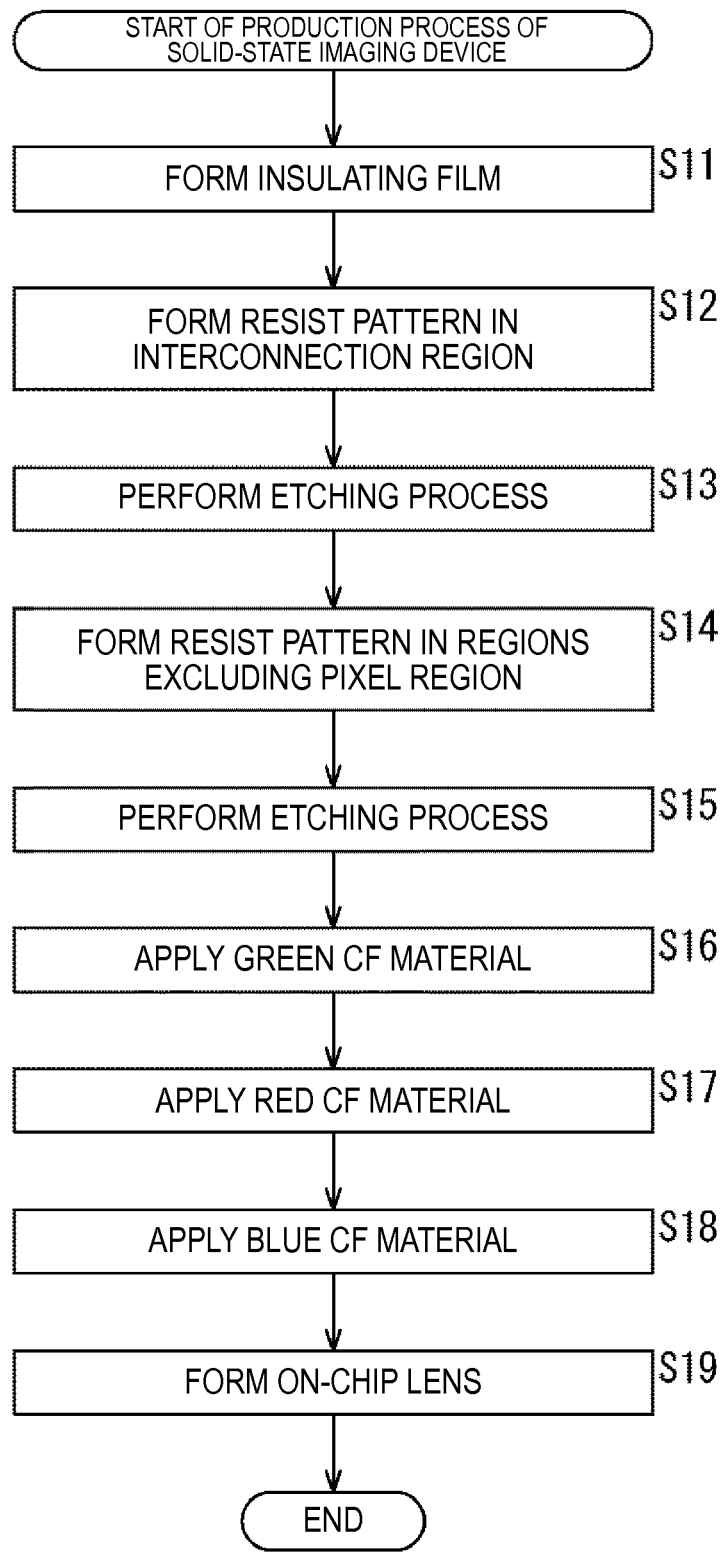
FIG. 4 is a flowchart for describing a process of producing a solid-state imaging device.
Figure 5:
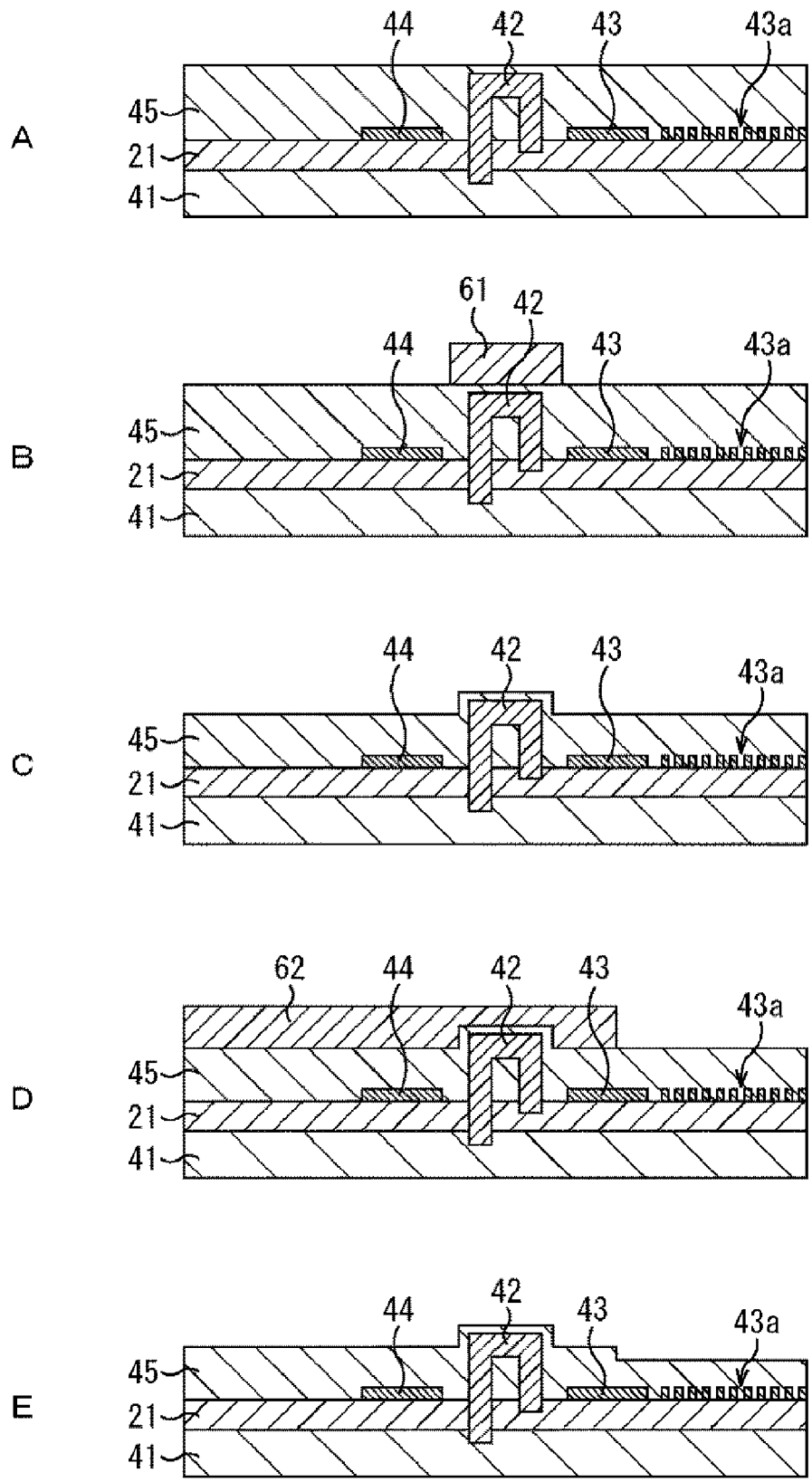
FIG. 5 is a cross-sectional view showing steps of production of a solid-state imaging device.

Next, a process of producing the solid-state imaging device 20 will be described with reference to FIG. 4 and FIG. 5. FIG. 4 is a flowchart for describing the process of producing the solid-state imaging device 20. FIG. 5 is a cross-sectional view of the solid-state imaging device 20 during steps of the production.

Note that, in the description that follows, the process until the through-via 42, the light shield film 43, and the peripheral circuit 44 are formed on the light receiving surface side of the sensor substrate 21 is commonly performed, and therefore, will not be described, and the subsequent process will be described.

Specifically, in step S11, as shown in FIG. 5A, the insulating film 45 is formed on the light receiving surface side of the sensor substrate 21 so that the through-via 42, the light shield film 43, and the peripheral circuit 44 are buried in the insulating film 45.

In step S12, as shown in FIG. 5B, a resist pattern 61 is formed in the interconnection region 32.

In step S13, an etching process is performed using the resist pattern 61 as a mask. As a result, as shown in FIG. 5C, the insulating film 45 is etched in regions other than the region where the resist pattern 61 is formed, i.e., the effective pixel region 31, the peripheral region 33, and the middle region 34.

In step S14, as shown in FIG. 5D, a resist pattern 62 is formed in the interconnection region 32.

In step S15, an etching process is performed using the resist pattern 62 as a mask. As a result, as shown in FIG. 5E, the insulating film 45 is etched in regions other than the region where the resist pattern 62 is formed, i.e., the effective pixel region 31 and a portion of the middle region 34.

In step S16, a green CF material is applied on the insulating film 45. Moreover, in step S17, a red CF material is applied, and in step S18, a blue CF material is applied.

Thereafter, in step S19, an on-chip lens is formed for each effective pixel of the effective pixel region 31, and the process of producing the solid-state imaging device 20 is ended.

Here, in the above process, it is assumed that different cross-sectional heights are formed in different regions by etching the insulating film 45. Alternatively, different cross-sectional heights may be formed by etching a planarization film, protective film, or the like formed on the sensor substrate 21.

According to the above process, a difference in height between the peripheral region 33 and the interconnection region 32 is reduced, and multiple steps are provided between the interconnection region 32 and the effective pixel region 31, and therefore, fluid pressure that occurs at the steps during application of an organic material, such as a CF material or the like, is reduced. This can reduce uneven application, and therefore, the applied organic material can be caused to have a uniform thickness.

Note that, in the above process, it is assumed that the region that is etched using the resist pattern 61 or the resist pattern 62 as a mask has a rectangular plan-view shape. Alternatively, etching may be performed so that a corner portion(s) of the rectangle has a round corner shape.

Figure 6:
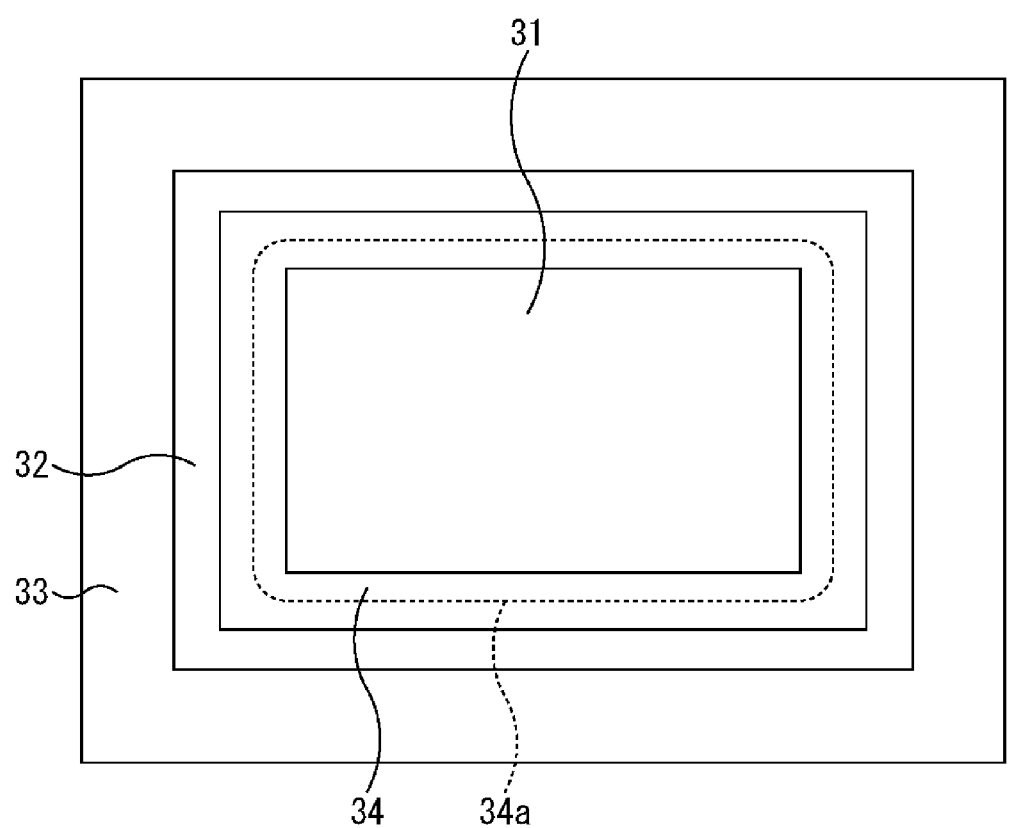
FIG. 6 is a plan view showing a variation of a solid-state imaging device.

For example, if a corner portion of the rectangular region that is etched using the resist pattern 62 as a mask is caused to have a round corner shape, a corner portion of a plan-view shape of the step portion 34a in the middle region 34 is caused to have a round corner shape as shown in FIG. 6.

Figure 7:
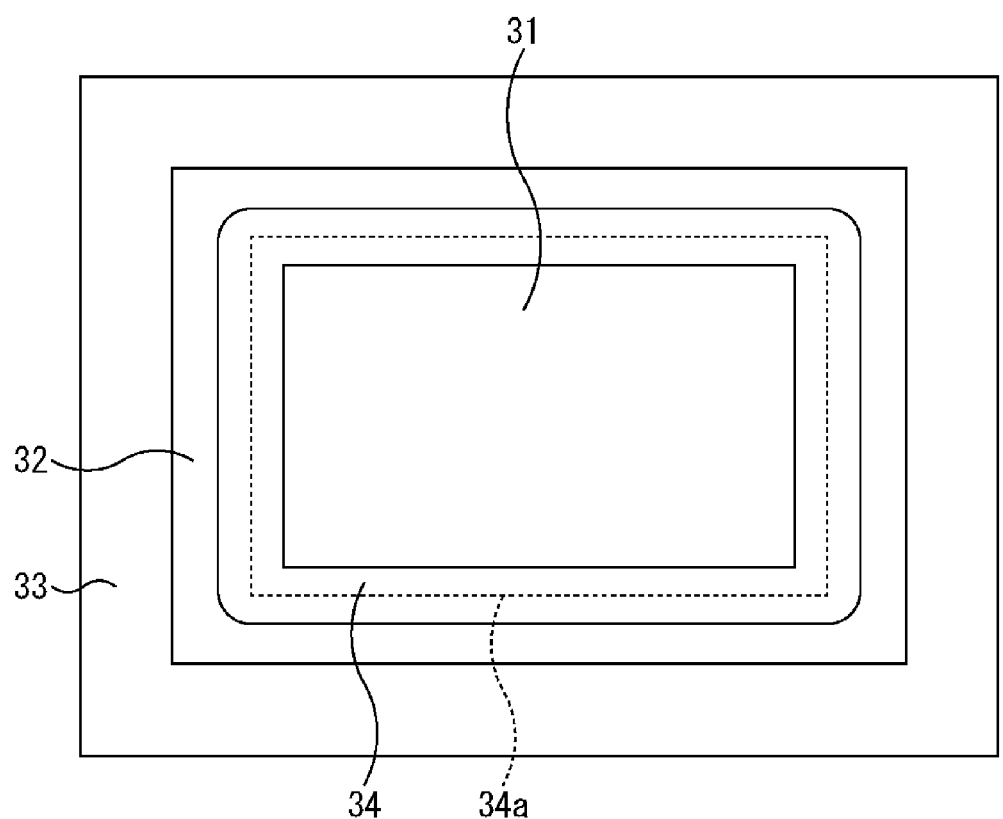
FIG. 7 is a plan view showing a variation of a solid-state imaging device.

Also, if an inner corner portion (closer to the effective pixel region 31) of the rectangular region that is etched using the resist pattern 61 as a mask is caused to have a round corner shape, a corner portion of a plan-view shape of the step portion between the interconnection region 32 and the middle region 34 is caused to have a round corner shape as shown in FIG. 7.

Figure 8:
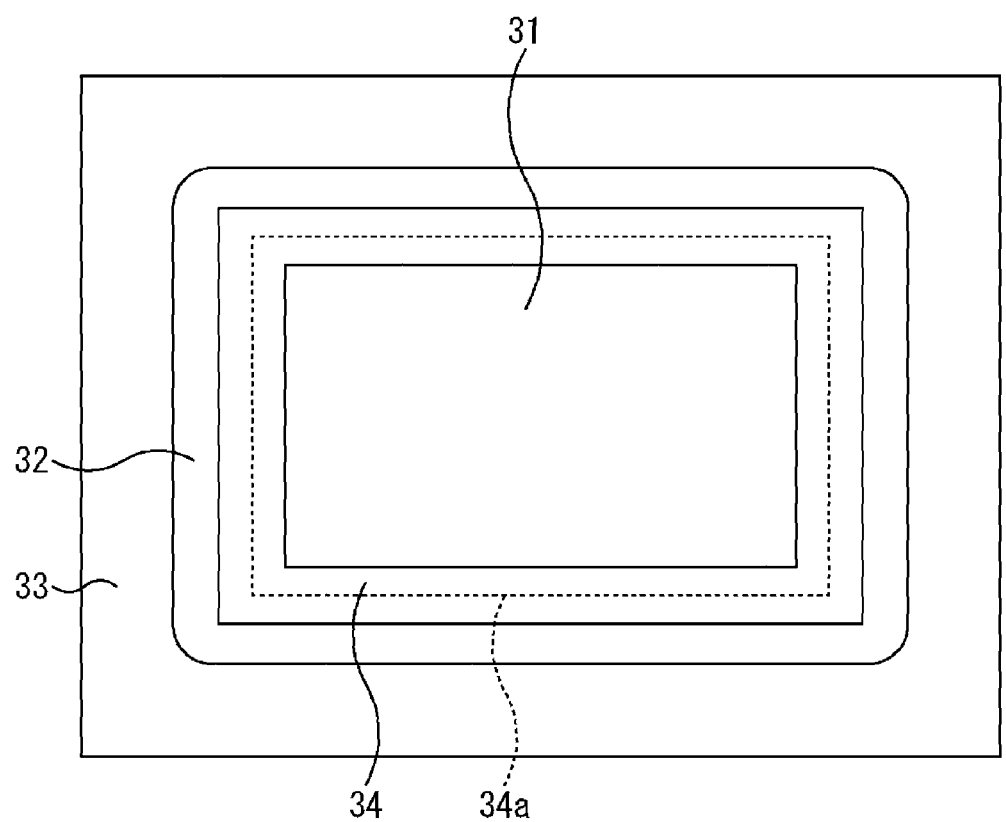
FIG. 8 is a plan view showing a variation of a solid-state imaging device.

Moreover, if an outer corner portion (closer to the peripheral region 33) of the rectangular region that is etched using the resist pattern 61 as a mask is caused to have a round corner shape, a corner portion of a plan-view shape of the step portion between the interconnection region 32 and the peripheral region 33 is caused to have a round corner shape as shown in FIG. 8. Note that the corner portion of the plan-view shape of the step portion between the interconnection region 32 and the peripheral region 33 may be caused to have a round corner shape by cutting the corner.

By thus causing a corner portion of a plan-view shape of the step portion to have a round corner shape, the organic material flowing and striking the corner can be caused to flow smoothly, and therefore, uneven application can be further reduced.

Note that the process of causing a portion of a plan-view shape of the step portion to have a round corner shape by etching may be performed on all of the step portions described with reference to FIG. 6 to FIG. 8, or may be performed on any of the step portions.

Also, not all corners (four corners) of the rectangular step portion need to have a round corner shape. Any of the corners of a predetermined step portion may be caused to have a round corner shape, depending on a direction in which a CF material is applied.

2. Second Embodiment (Example Configuration of Solid-State Imaging Device)

Figure 9:
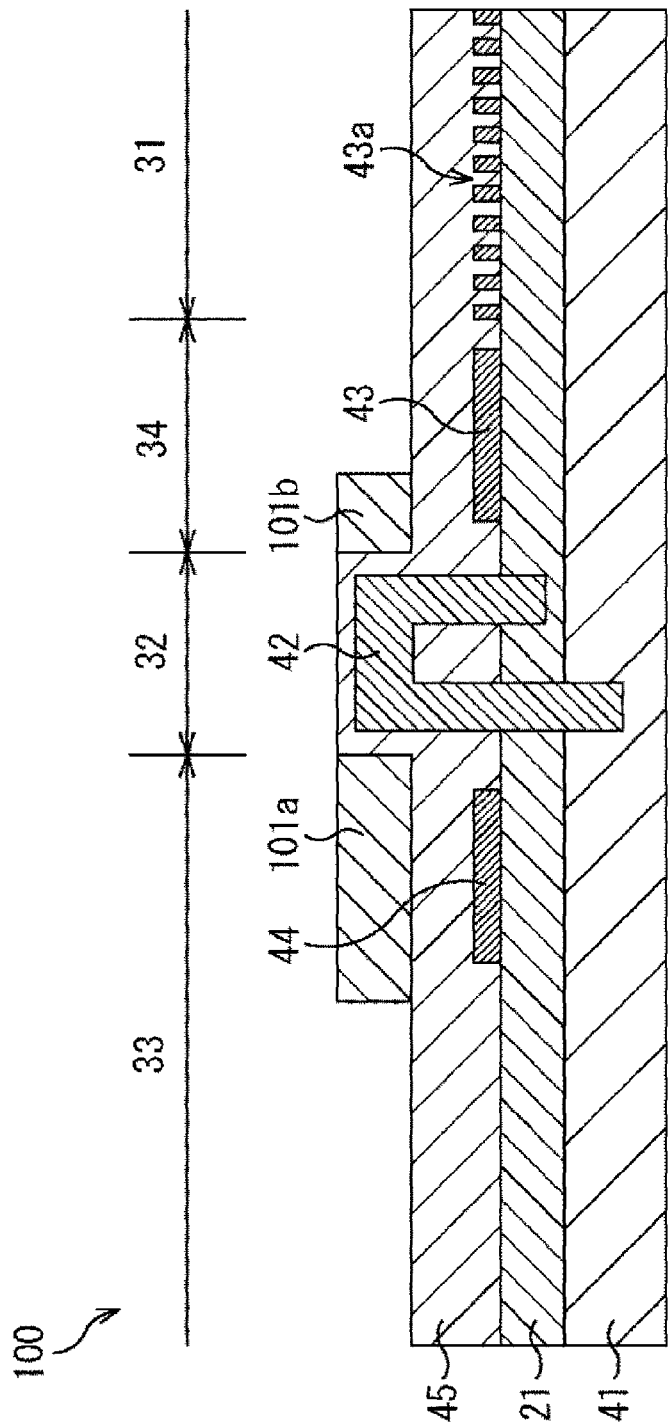
FIG. 9 is a cross-sectional view showing an example configuration of a solid-state imaging device of a second embodiment of the present technology.

FIG. 9 is a cross-sectional view showing an example configuration of a solid-state imaging device of a second embodiment of the present technology.

Note that, in the cross-sectional view of FIG. 9, parts similar to those of the cross-sectional view of FIG. 3 are indicated by the same names and the same reference characters, and will not be described, except where necessary.

Figure 1:
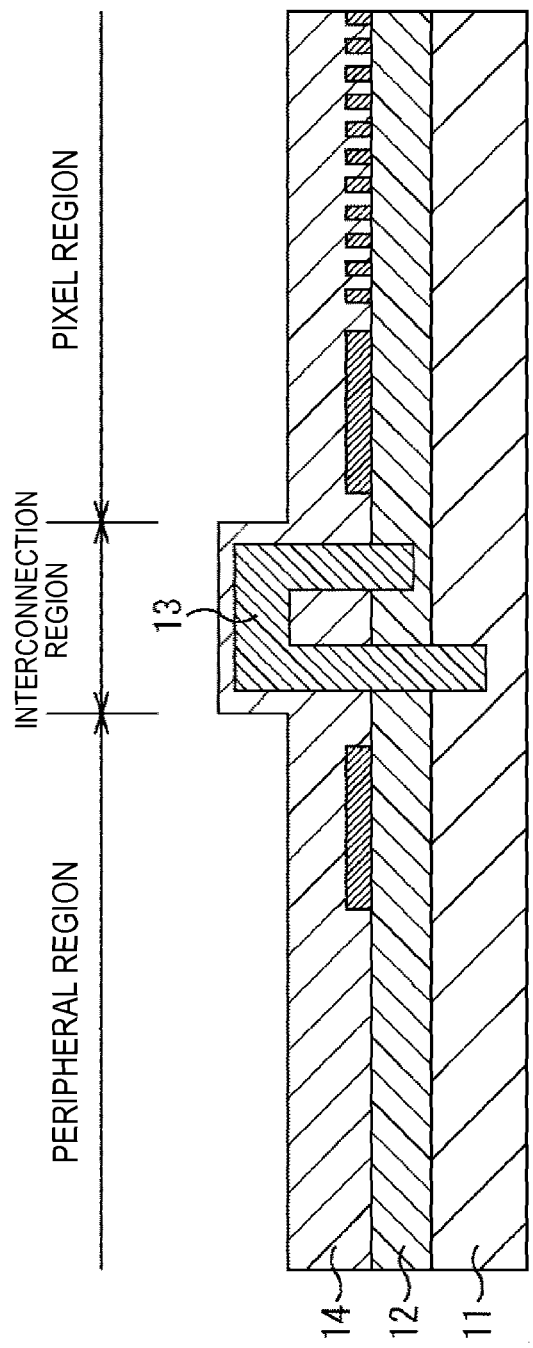
FIG. 1 is a cross-sectional view showing an example configuration of a conventional solid-state imaging device.

In the solid-state imaging device 100 shown in FIG. 9, as in the solid-state imaging device of FIG. 1, cross-sectional heights of the insulating film 45 in the peripheral region 33 and the middle region 34 are the same as a cross-sectional height of the insulating film 45 in the effective pixel region 31. Also, in a region (hereinafter referred to as an adjacent region) adjacent to the interconnection region 32, formed are organic members 101a and 101b as a height adjustment member for causing a cross-sectional height in the adjacent region to be generally the same as the cross-sectional height in the interconnection region 32.

Figure 10:
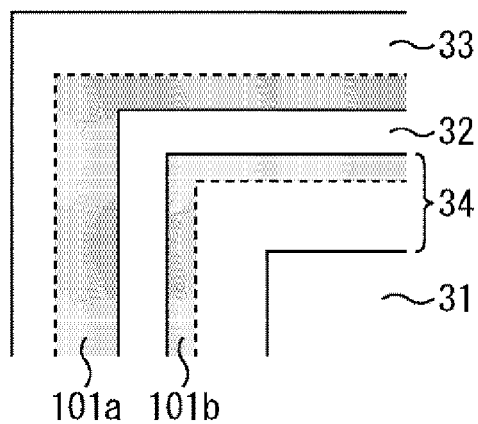
FIG. 10 is a diagram showing an example organic member formed in a region adjacent to an interconnection region.

Specifically, as shown in FIG. 10, the organic members 101a and 101b are formed in regions adjacent to the peripheral region 33 and the middle region 34 to increase a width of the extending interconnection region 32 having a bump-shaped cross-section. The organic members 101a and 101b are formed of, for example, silicon oxide ($SiO_2$) as with the insulating film 45.

By thus increasing the width of the interconnection region 32 having a bump-shaped cross-section, uneven application can be reduced during application of the organic material, and therefore, the applied organic material can be caused to have a uniform thickness.

Figure 11:
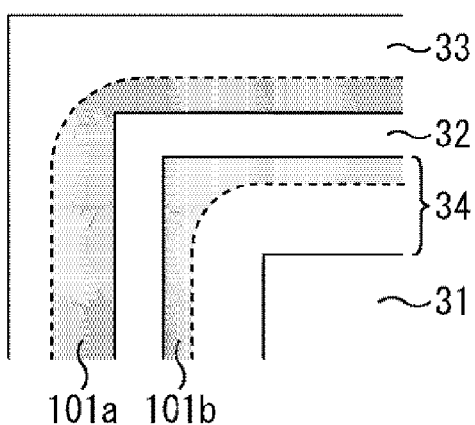
FIG. 11 is a diagram showing an example organic member formed in a region adjacent to an interconnection region.

Note that, as shown in FIG. 11, the organic members 101a and 101b formed at a corner of a plan-view shape of the interconnection region 32 may be caused to have a round corner shape. The round corner shape may have a curvature of, for example, 500 μm or more. This allows the organic material flowing and striking the corner to flow smoothly, and therefore, uneven application can be further reduced.

Although, in FIG. 11, both of the organic members 101a and 101b have a corner portion having a round corner shape, any of the organic members 101a and 101b may have a corner portion having a round corner shape.

Figure 12:
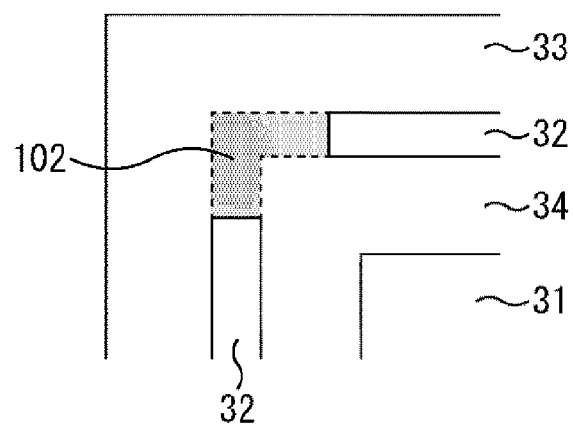
FIG. 12 is a diagram showing an example organic member formed in a region adjacent to an interconnection region.

Also, as shown in FIG. 12, when the plan-view shape of the interconnection region 32 has a gap (discontinuous portion) at a portion thereof (a corner in FIG. 12), an organic member 102 may be formed as an adjacent region to fill the gap.

By thus filling the gap of the plan-view shape of the interconnection region 32, disturbance of the flow of fluid that would occur at the gap is reduced during application of an organic material, such as a CF material or the like, and therefore, uneven application can be further reduced.

Figure 13:
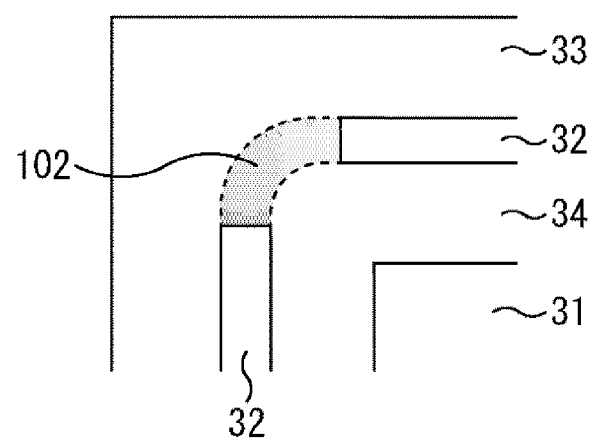
FIG. 13 is a diagram showing an example organic member formed in a region adjacent to an interconnection region.

Note that, as shown in FIG. 13, the organic member 102 that is formed in the gap of the plan-view shape of the interconnection region 32, may be formed to have a round corner shape. The round corner shape may have a curvature of, for example, 500 μm or more. This allows the organic material flowing and striking the corner to flow smoothly, and therefore, uneven application can be further reduced.

Although, in FIG. 13, both of the inner and outer corners of the organic member 102 have a round corner shape, any of the inner and outer corners of the organic member 102 may have a round corner shape.

Note that the configuration shown in FIG. 12 or FIG. 13 may be combined with the configuration of FIG. 10 or FIG. 11 to increase the width of the interconnection region 32.

Figure 14:
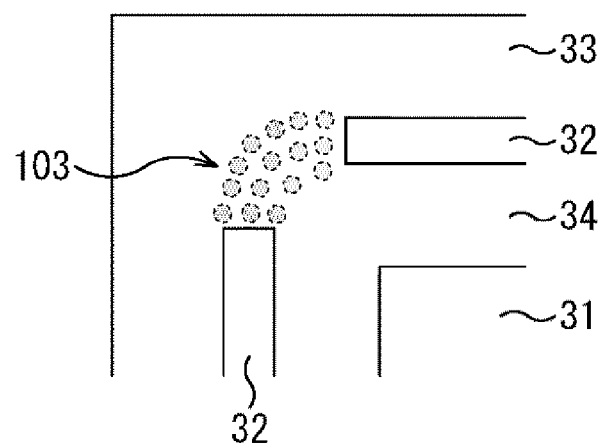
FIG. 14 is a diagram showing an example organic member formed in a region adjacent to an interconnection region.

Moreover, as shown in FIG. 14, an organic member 103 in the shape of dots may be formed to fill the gap of the plan-view shape of the interconnection region 32. In this case, for example, each dot has a diameter of 2 μm or more, and a space between each dot is 5 μm or more. Note that the shape of the dot is not limited to a circle, and may be a rectangle, triangle, or the like.

Note that, in the above configuration, a difference between the cross-sectional height in the interconnection region 32 and the cross-sectional height in the adjacent region is desirably within the range of ±400 μm.

(Process of Producing Solid-State Imaging Device)

Next, a process of producing the solid-state imaging device 100 will be described with reference to a flowchart of FIG. 15.

Figure 15:
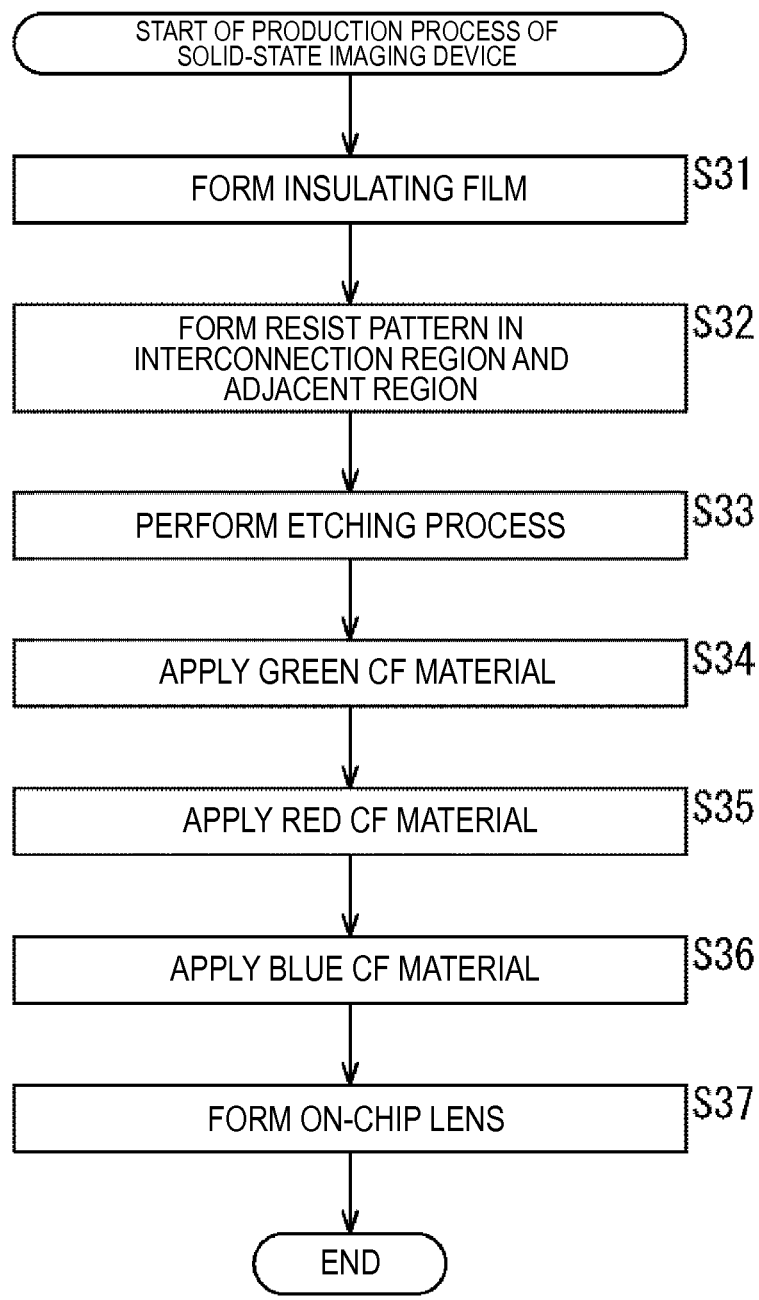
FIG. 15 is a flowchart for describing a process of producing a solid-state imaging device.

Note that processes of steps S31 and S34 to S37 of the flowchart of FIG. 15 are similar to the processes of steps S11 and S16 to S19 of the flowchart of FIG. 4, and therefore, will not be described.

Specifically, in step S32, a resist pattern is formed in the interconnection region 32 and the adjacent region.

Thereafter, in step S33, an etching process is performed using the formed resist pattern as a mask. Here, the insulating film 45 is etched so that the cross-sectional height in the final effective pixel region 31 is the same as the cross-sectional heights in the peripheral region 33 and the middle region 34 excluding the adjacent region.

According to the above process, an organic member is formed in the region adjacent to the interconnection region 32, so that, as described above, uneven application can be reduced during application of an organic material, such as a CF material or the like, and therefore, the applied organic material is caused to have a uniform thickness.

Note that the organic member formed in the region adjacent to the interconnection region 32 may be formed of, for example, a green CF material. In this case, in step S32 of the flowchart of FIG. 15, a resist pattern is formed only in the interconnection region, and the organic member is formed in the region adjacent to the interconnection region 32 using the green CF material prior to application of the green CF material in step S34.

Figure 16:
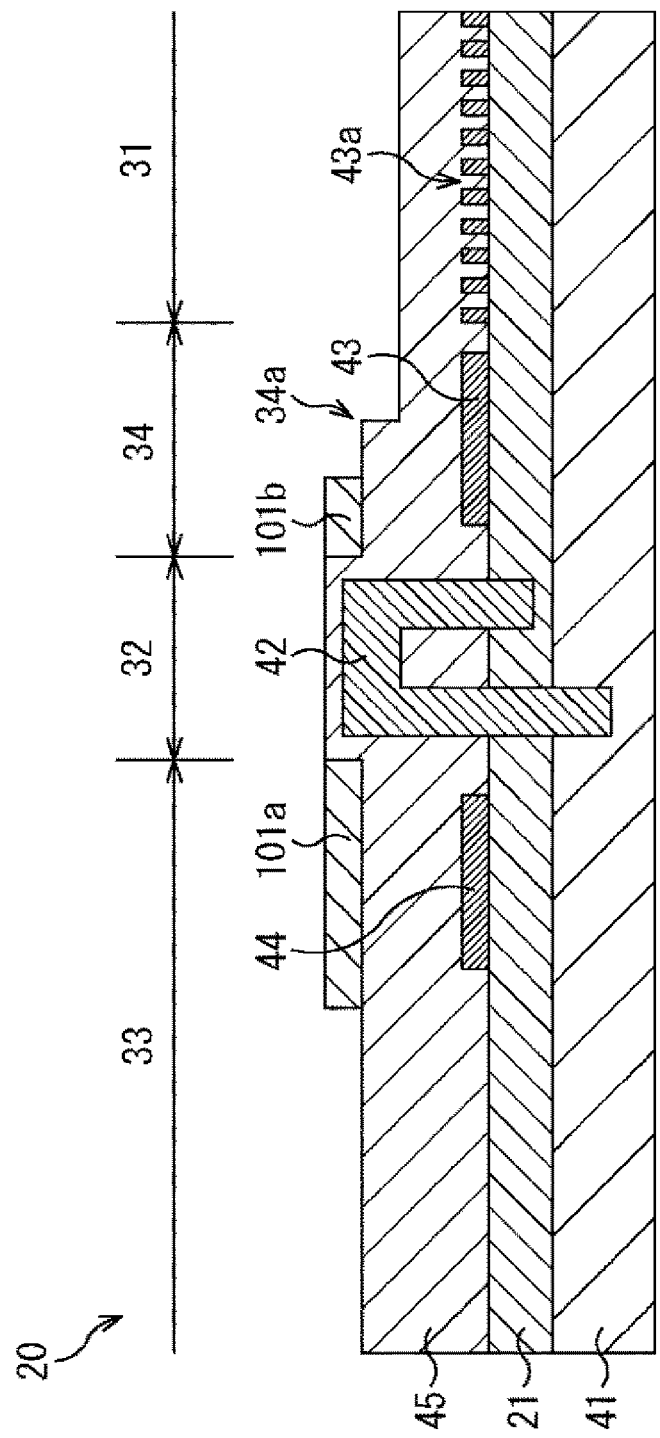
FIG. 16 is a cross-sectional view showing a variation of a solid-state imaging device.

Also, as shown in FIG. 16, in the solid-state imaging device 20 of the first embodiment, organic members 101a and 101b may be formed in regions (the peripheral region 33 and the middle region 34) adjacent to the interconnection region 32, or although not shown, an organic member may be formed in the gap of the plan-view shape of the interconnection region 32. This can further reduce uneven application of the organic material.

Figure 17:
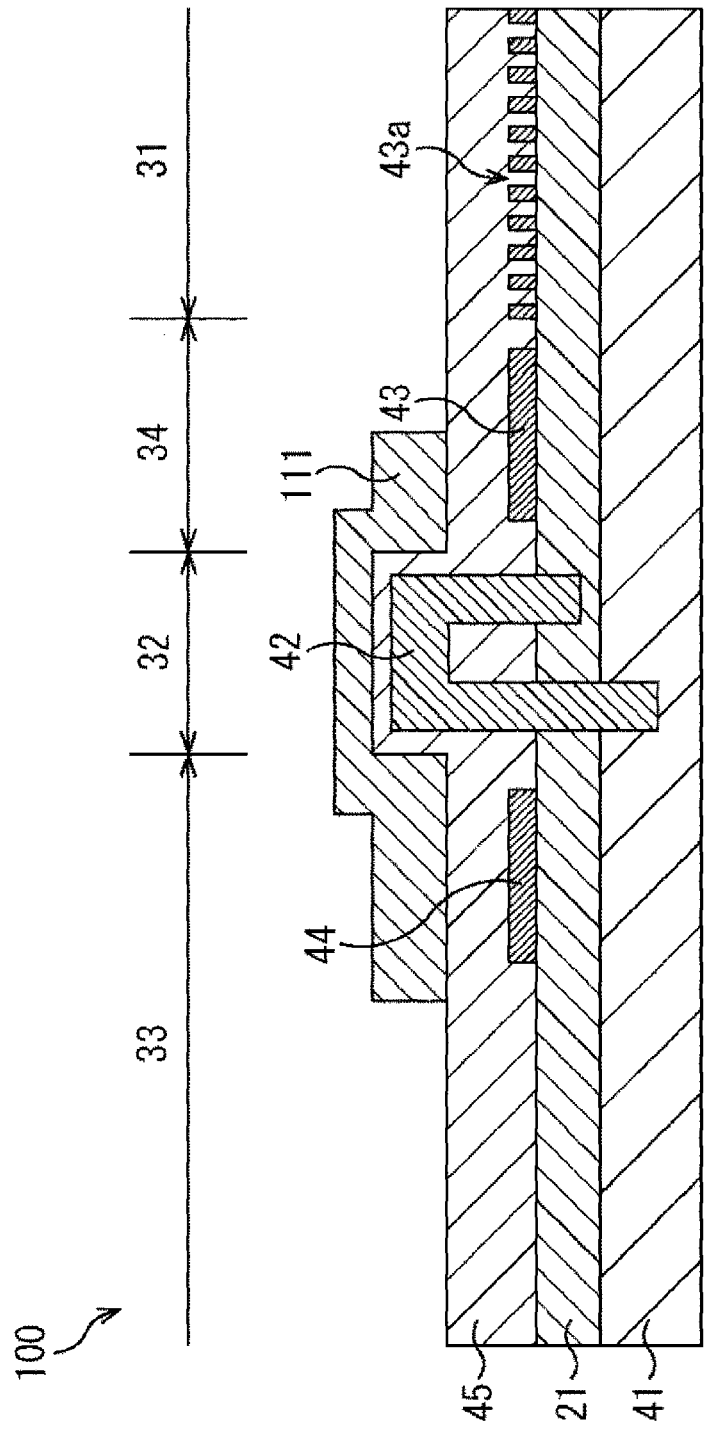
FIG. 17 is a cross-sectional view showing a variation of a solid-state imaging device.

Moreover, as shown in FIG. 17, as a height adjustment member, an organic member 111 may be formed that causes the cross-sectional height in the adjacent region to be generally the same as the cross-sectional height in the interconnection region 32, and in addition, causes the cross-sectional height in a region including at least the interconnection region 32 to be greater than the cross-sectional height in the adjacent region. Specifically, the solid-state imaging device 100 of FIG. 17 is the solid-state imaging device 100 of FIG. 9 in which a bump portion (organic member) that causes the cross-sectional height in the region including at least the interconnection region 32 to be greater than the cross-sectional height in the adjacent region is provided on that region including the interconnection region 32.

Note that, in the solid-state imaging device 100 of FIG. 17, the cross-sectional height in the adjacent region may be generally the same as the cross-sectional height in the interconnection region 32, or may be greater than or equal to the cross-sectional height in the interconnection region 32 (note that the cross-sectional height in the adjacent region may be smaller than the cross-sectional height in the region including the interconnection region 32).

By thus providing multiple steps between the peripheral region 33 and the interconnection region 32 and between the interconnection region 32 and the effective pixel region 31, uneven application can be reduced.

Figure 18:
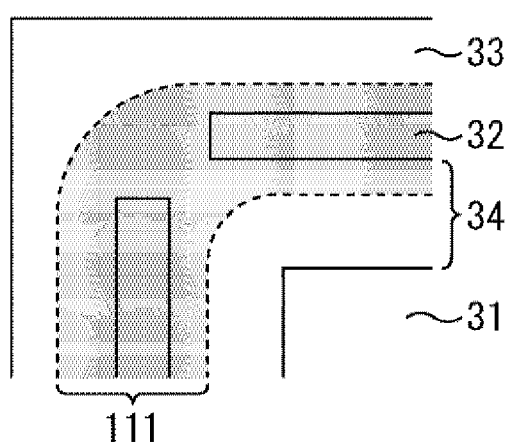
FIG. 18 is a diagram showing an example organic member formed in an interconnection region and an adjacent region.

Note that, as in FIG. 11, as shown in FIG. 18, the organic member 111 may be formed to have a corner portion having a round corner shape. This allows the organic material flowing and striking the corner of the organic member 111 to flow smoothly, and therefore, uneven application can be further reduced.

Although, in FIG. 18, both of the inner and outer corner portions of the organic member 111 have a round corner shape, any of the inner and outer corner portions of the organic member 102 may have a round corner shape.

Note that when the organic member 111 is, for example, formed of the same material as that of the insulating film 45, the organic member 111 is formed as follows. After the insulating film 45 is formed in step S31 of the flowchart of FIG. 15, a resist pattern is formed in the region including the interconnection region 32 (a region where the cross-sectional height is greatest), an etching process is performed, and the process of step S32 and the following processes are performed.

Figure 19:
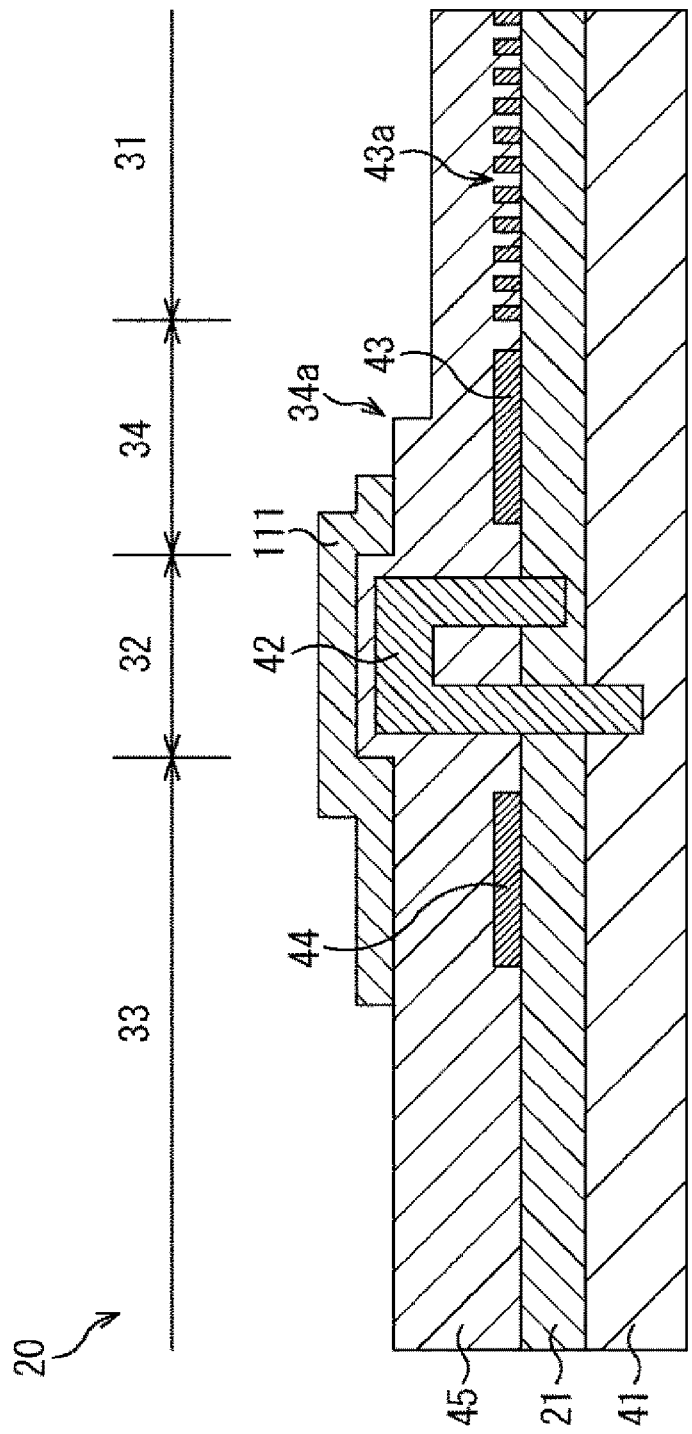
FIG. 19 is a cross-sectional view showing a variation of a solid-state imaging device.

Moreover, also, as shown in FIG. 19, in the solid-state imaging device 20 of the first embodiment, the organic member 111 may be formed. As a result, more steps are provided between the interconnection region 32 and the effective pixel region 31, and therefore, uneven application of the organic material can be further reduced.

Figure 20:
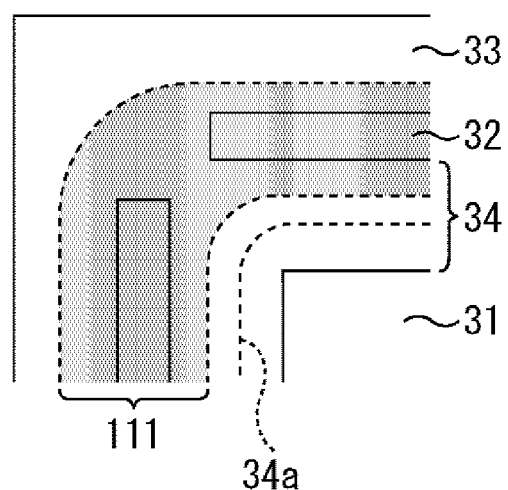
FIG. 20 is a diagram showing an example organic member formed in an interconnection region and an adjacent region.

Also, in the configuration shown in FIG. 19, as shown in FIG. 20, the organic member 111 may be formed to have a corner portion having a round corner shape. This allows the organic material flowing and striking the corner of the organic member 111 to flow smoothly, and therefore, uneven application can be further reduced.

Although, also in FIG. 20, both of the inner and outer corner portions of the organic member 111 have a round corner shape, any of the inner and outer corner portions of the organic member 102 may have a round corner shape.

Also, in the foregoing, not all corners (four corners) of the organic member need to have a round corner shape. Any of the corners of the organic member may be caused to have a round corner shape, depending on a direction in which a CF material is applied.

In the foregoing, a corner portion of the organic member has a round corner shape in order to reduce uneven application. However, if there are constraints on the arrangement of alignment marks or interconnects, it may not be possible to cause a round corner of the organic member to have a round corner shape that has a curvature effective in reducing uneven application.

Figure 21:
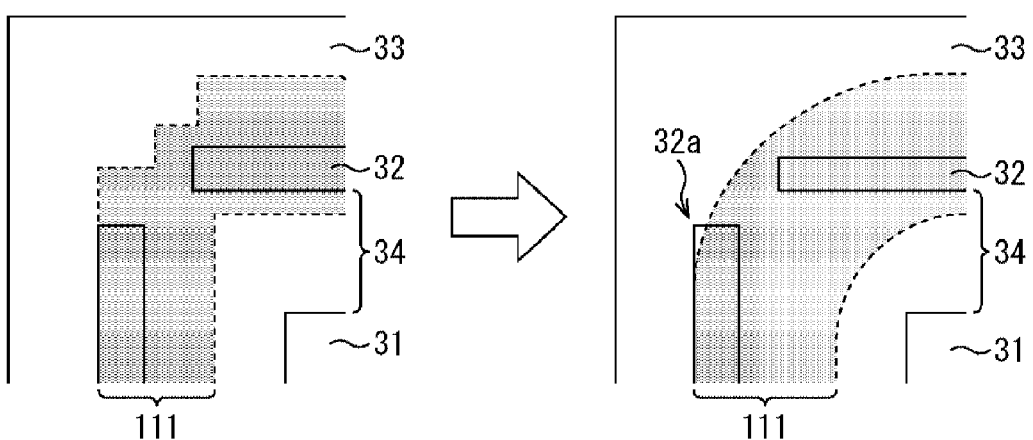
FIG. 21 is a diagram for describing a shape of a corner portion of an organic member.

For example, as shown on a left side of FIG. 21, when the organic member 111 is formed under the constraints of the interconnection region 32 and alignment marks (not shown), then if a corner portion of the organic member 111 has a round corner shape having a curvature of, for example, 500 μm or more as described above, the organic member 111 is not formed in a region 32a that is a portion of the interconnection region 32.

Note that if the organic member is formed of, for example, a green CF material, the organic member functions as an anti-reflection film that reduces flares or ghost images. In order to improve the function as an anti-reflection film, it is desirable to form an organic member having as large an area as possible. However, if the organic member is caused to have a corner portion having a round corner shape, there is a great reduction in the area.

Therefore, in the description that follows, an example organic member will be described that is useful even if there are constraints on the arrangement of alignment marks, interconnects, or the like, or the organic member is used as an anti-reflection film. Note that, as the organic member, the organic member 111 shown in FIG. 17 will be described by way of example.

(Variations of Organic Member)

Figure 22:
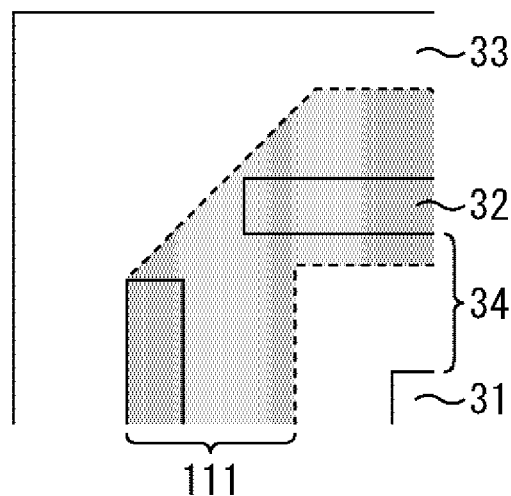
FIG. 22 is a diagram showing an example organic member formed in an interconnection region and an adjacent region.

Firstly, as shown in FIG. 22, the organic member 111 may be formed to have a corner portion that is beveled to have a beveled shape. In FIG. 22, as viewed from above, a corner portion of the organic member 111 is cut along a straight line intersecting two sides forming the corner portion at 45°, and two newly formed corners have an angle of 135°. The beveled portion has a length of, for example, 200 μm or less. This allows the organic material flowing and striking the corner to flow smoothly, and therefore, uneven application can be further reduced.

Note that, as viewed from above, the angle (slope) of the straight line along which a corner portion of the organic member 111 is cut is not limited to 45°. Also, corner portions newly formed by beveling may be further beveled. By repeatedly performing beveling, the shape of the corner can be caused to approach a round corner shape.

Figure 23:
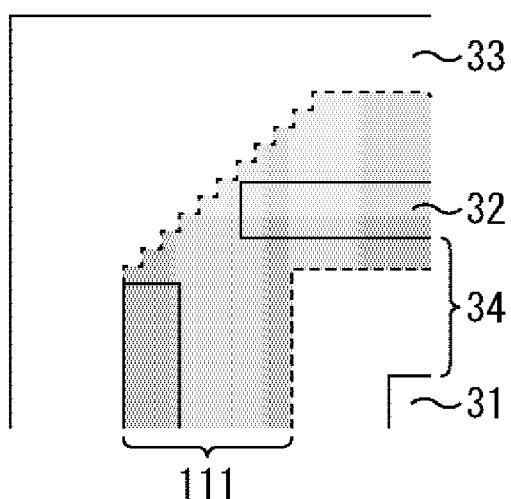
FIG. 23 is a diagram showing an example organic member formed in an interconnection region and an adjacent region.

Also, as shown in FIG. 23, as viewed from above, a corner portion of the organic member 111 may be cut along a zigzag line extending along a straight line intersecting two sides forming the corner portion at 45°. The zigzag line is a triangular wave-shaped zigzag line that is a repetition of a very short straight line (e.g., a straight line of 10 μm or less) whose direction changes alternately by a predetermined angle (e.g., 90°). In this case, as viewed macroscopically, the corner portion of the organic member 111 is like a corner portion that is beveled along a straight line as in the example of FIG. 22.

Note that if the zigzag line along which a corner portion of the organic member 111 is cut is caused to extend along an arc-shaped curve having a predetermined curvature, the corner portion of the organic member 111 may be caused to have a round corner shape as viewed macroscopically, as in the example of FIG. 17.

Figure 24:
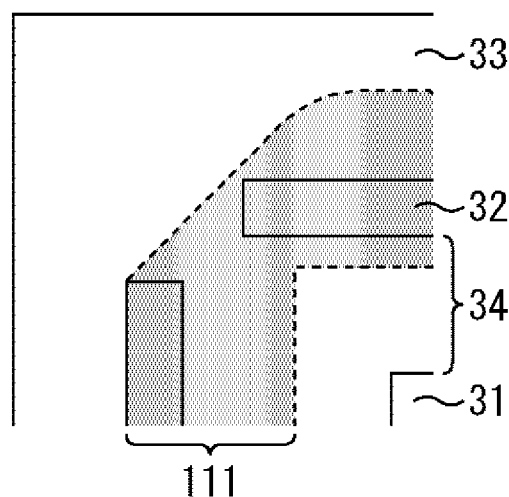
FIG. 24 is a diagram showing an example organic member formed in an interconnection region and an adjacent region.
Figure 25:
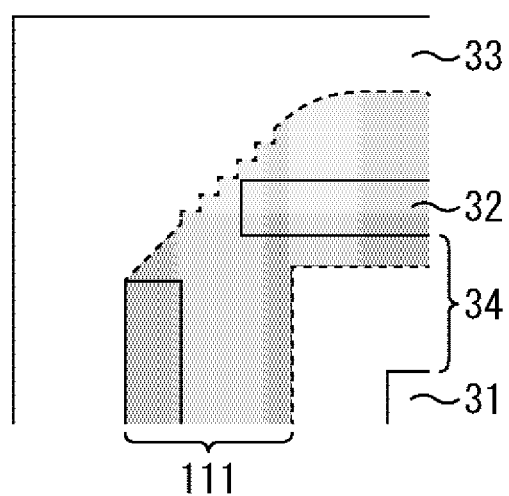
FIG. 25 is a diagram showing an example organic member formed in an interconnection region and an adjacent region.

Also, as shown in FIG. 24, as viewed from above, a corner portion of the organic member 111 may be beveled along a straight line intersecting two sides forming the corner portion at 45°, a portion of which is a curved line. Alternatively, as shown in FIG. 25, as viewed from above, a corner portion of the organic member 111 may be beveled along a straight line intersecting two sides forming the corner portion at 45°, a portion of which is a zigzag line.

Figure 26:
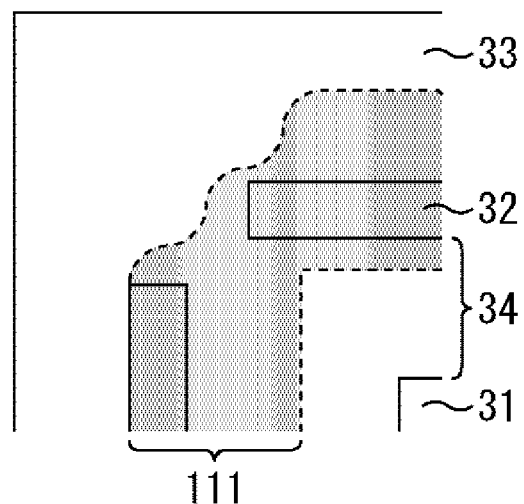
FIG. 26 is a diagram showing an example organic member formed in an interconnection region and an adjacent region.

Moreover, in the organic member 111 having a zigzag-shaped corner portion under constraints on alignment marks as shown on a left side of FIG. 21, the corner portion may be beveled so that each corner portion is curved to form a wave shape as shown in FIG. 26.

Note that the above variations are not limited to the organic member 111 shown in FIG. 17, and may be applied to the organic members 101a and 101b shown in FIG. 9 and FIG. 16, the organic member 102 shown in FIG. 13, and the organic member 111 shown in FIG. 19.

Also, in the first embodiment, a corner portion of a plan-view shape of the step portion 34a in the middle region 34 (FIG. 6), a corner portion of a plan-view shape of the step portion between the interconnection region 32 and the middle region 34 (FIG. 7), and a corner portion of a plan-view shape of the step portion between the interconnection region 32 and the peripheral region 33 (FIG. 8) have a round corner shape. Alternatively, at least one of the corner portions of the plan-view shapes of these step portions may have a beveled shape as described with reference to FIG. 22 to FIG. 26.

Figure 27:
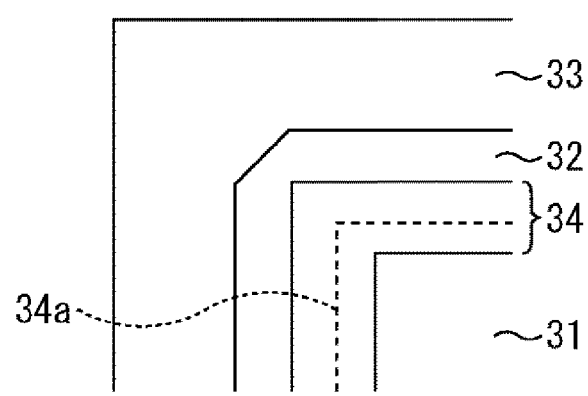
FIG. 27 is a plan view showing a variation of a solid-state imaging device.

Specifically, for example, as shown in FIG. 27, a corner portion of a plan-view shape of the step portion between the interconnection region 32 and the peripheral region 33 may be beveled to a beveled shape.

This allows the organic material flowing and striking the corner in the step portion to flow smoothly, and therefore, uneven application can be further reduced.

3. Third Embodiment (Example Configuration of Solid-State Imaging Device)

Figure 28:
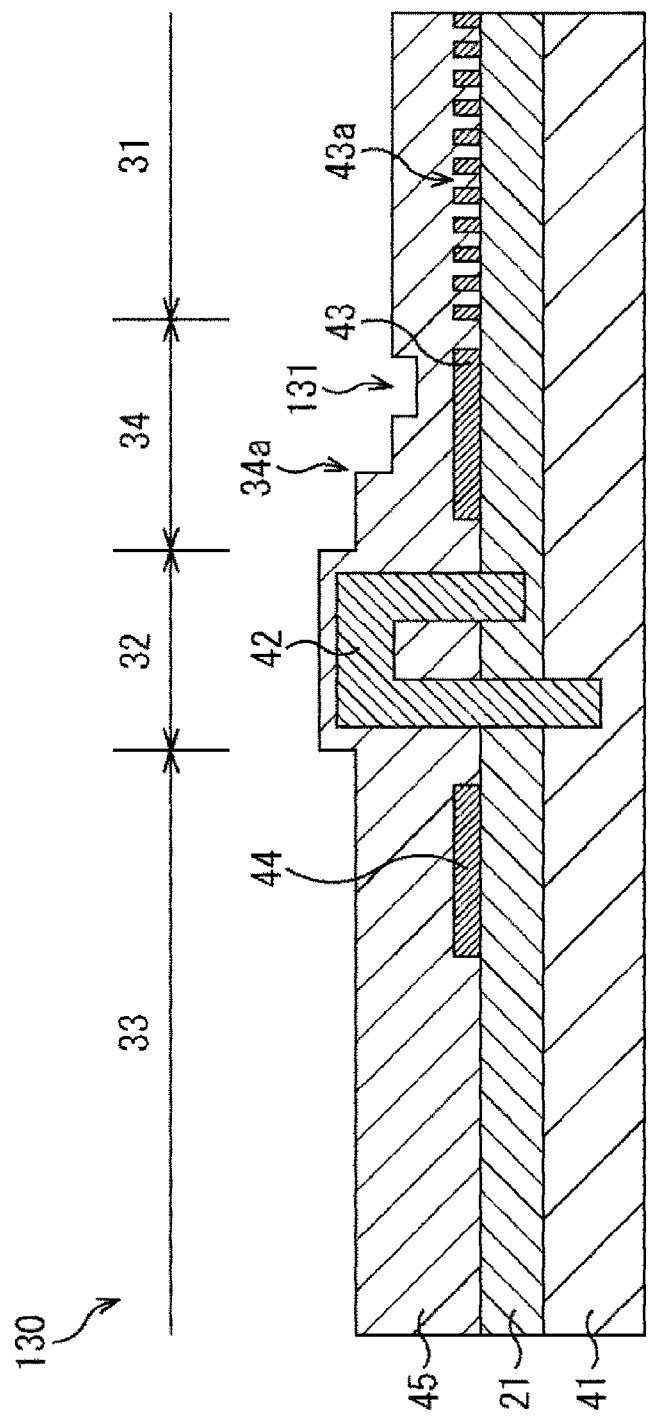
FIG. 28 is a cross-sectional view showing an example configuration of a solid-state imaging device of a third embodiment of the present technology.

FIG. 28 is a cross-sectional view showing an example configuration of a solid-state imaging device of a third embodiment of the present technology.

Note that, in the cross-sectional view of FIG. 28, parts similar to those of the cross-sectional view of FIG. 3 are indicated by the same names and the same reference characters, and will not be described, except where necessary.

In the solid-state imaging device 130 shown in FIG. 28, a recessed portion 131 having a smaller cross-sectional height than that of the effective pixel region 31 is formed in a region of the insulating film 45 in the middle region 34 that has the same cross-sectional height as that of the effective pixel region 31.

Figure 29:
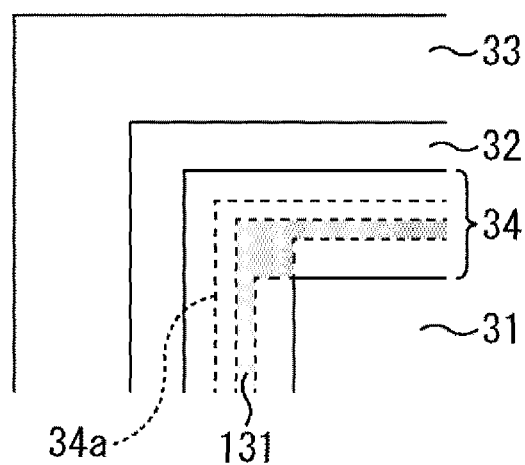
FIG. 29 is a diagram showing an example recessed portion formed in a middle region.

Specifically, as shown in FIG. 29, the recessed portion 131 is formed in the middle region 34, extending along a side of the separate rectangular effective pixel region 31.

By thus providing the recessed portion 131 in the middle region 34, when an organic material, such as a CF material or the like, is applied, a slope of the organic material that occurs due to the fluid held in the middle region 34 in the vicinity of the step portion 34a can be caused to be flat, and therefore, the applied organic material can be caused to have a uniform thickness.

Figure 30:
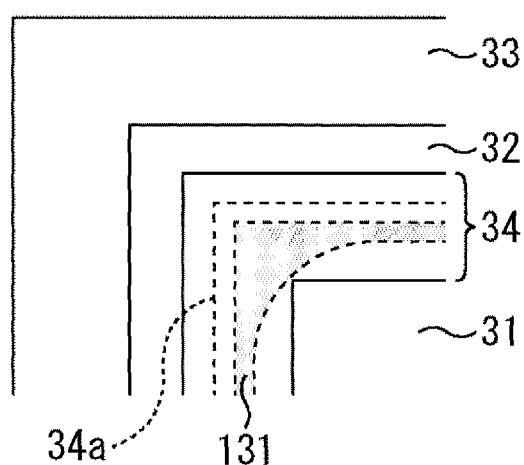
FIG. 30 is a diagram showing an example recessed portion formed in a middle region.

In particular, in the vicinity of a corner portion of a plan-view shape of the step portion 34a in which fluid is easily held, the recessed portion 131 may have a large rectangular corner portion as shown in FIG. 29. Alternatively, as shown in FIG. 30, an inner side of the corner portion of the recessed portion 131 may be caused to have a round corner shape.

Note that the recessed portion 131 is formed in step S15 of the flowchart of FIG. 4 as follows. After the insulating film 45 is etched in the effective pixel region 31 and a region that is a portion of the middle region 34, a resist pattern is formed in a region excluding the recessed portion 131, and an etching process is performed again.

Figure 31:
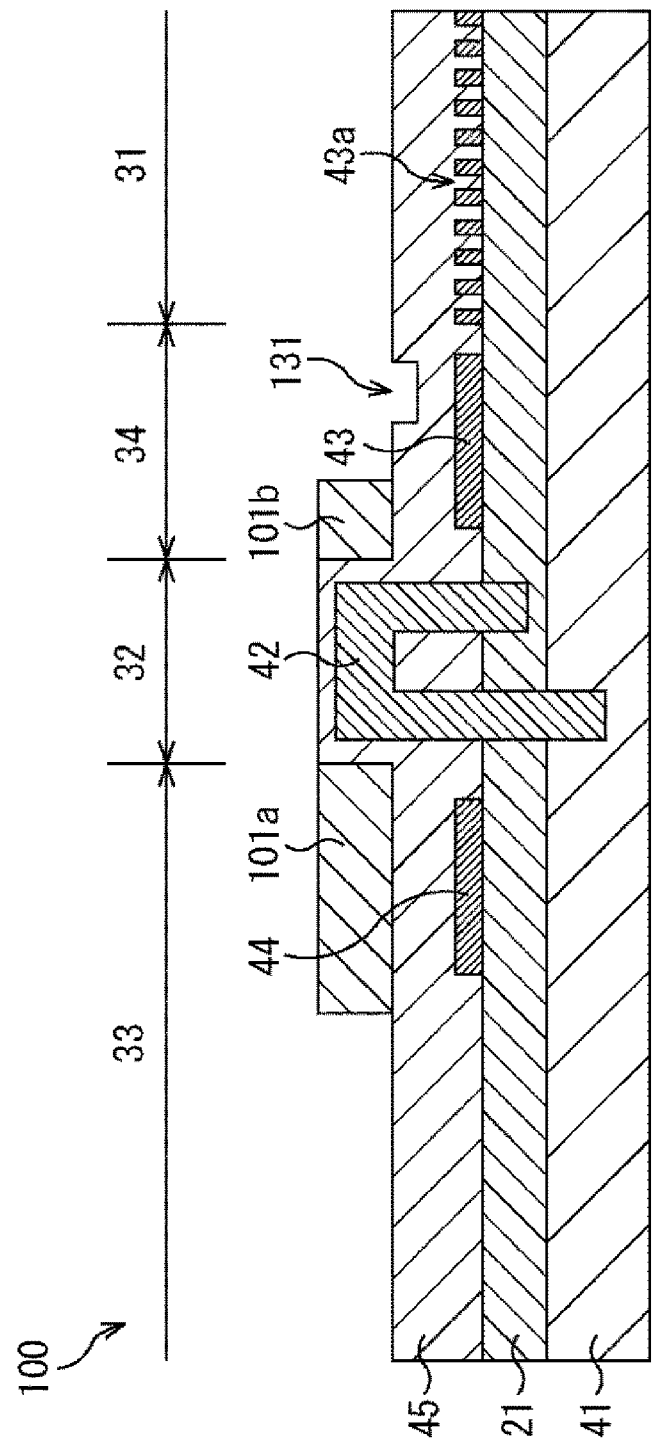
FIG. 31 is a cross-sectional view showing a variation of a solid-state imaging device.

Also, as shown in FIG. 31, a recessed portion 131 may be formed in the solid-state imaging device 100 of the second embodiment.

Figure 32:
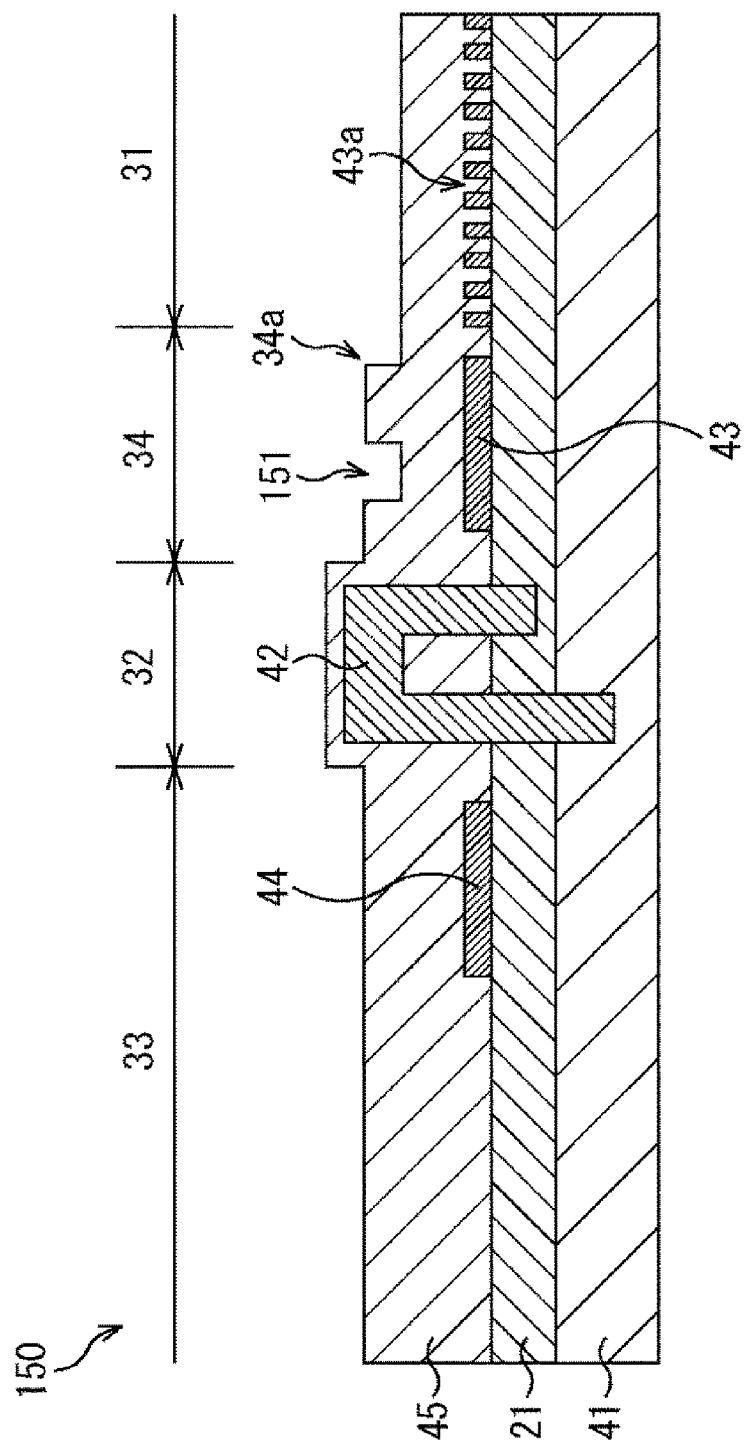
FIG. 32 is a cross-sectional view showing a variation of a solid-state imaging device.

Moreover, as in a solid-state imaging device 150 shown in FIG. 32, a recessed portion 151 that has the same cross-sectional height as that of the effective pixel region 31 may be formed in a region of the insulating film 45 in the middle region 34 that has the same cross-sectional height as that of the peripheral region 33.

Figure 33:
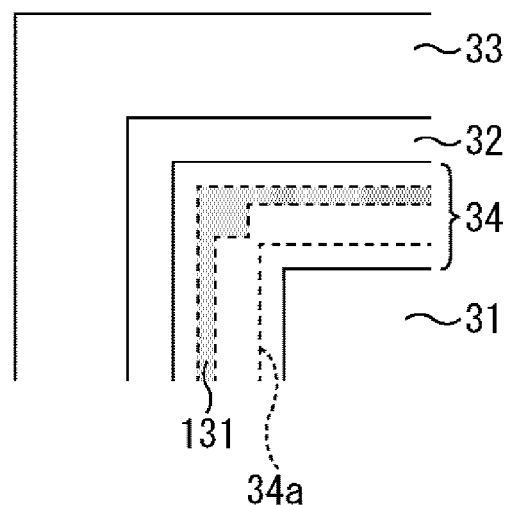
FIG. 33 is a diagram showing an example recessed portion formed in a middle region.

Also in this case, as in FIG. 29, as shown in FIG. 33, a recessed portion 151 is formed in the middle region 34, extending along a side of the separate rectangular effective pixel region 31 (step portion 34a).

By thus providing the recessed portion 151 in the middle region 34, when an organic material, such as a CF material or the like, is applied, a slope of the organic material that occurs due to the fluid held in the middle region 34 in the vicinity of the step portion between the interconnection region 32 and the middle region 34 can be caused to be flat, and therefore, the applied organic material can be caused to have a uniform thickness.

Figure 34:
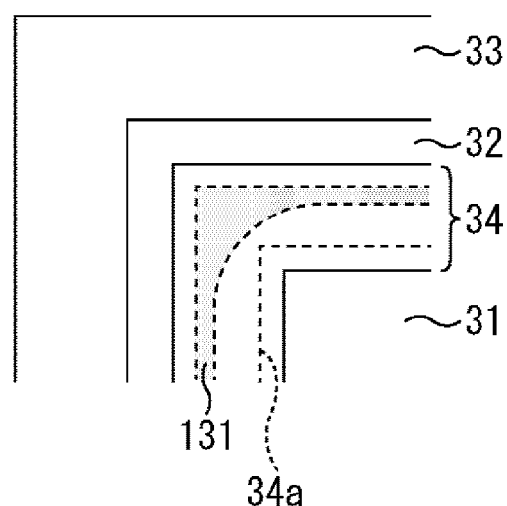
FIG. 34 is a diagram showing an example recessed portion formed in a middle region.

In particular, in the vicinity of a corner portion of a plan-view shape of the step portion 34a in which fluid is easily held, the recessed portion 151 may have a large rectangular corner portion as shown in FIG. 33. Alternatively, as shown in FIG. 34, an inner side of the corner portion of the recessed portion 151 may be caused to have a round corner shape.

Note that the recessed portion 151 is formed in step S15 of the flowchart of FIG. 4 as follows. The insulating film 45 is etched in the effective pixel region 31 and a region that is a portion of the middle region 34, and in addition, the recessed portion 151 is etched.

Note that, in the above solid-state imaging device of this embodiment, at least one of the corners of the plan-view shape of the step portion in each region may be caused to have a round corner shape or a beveled shape. Also, in the solid-state imaging device of this embodiment, as in the solid-state imaging device of the second embodiment, an organic member may be provided, and at least one of the corners of the organic member may be caused to have a round corner shape or a beveled shape.

4. Fourth Embodiment (Example Configuration of Solid-State Imaging Device)

Figure 35:
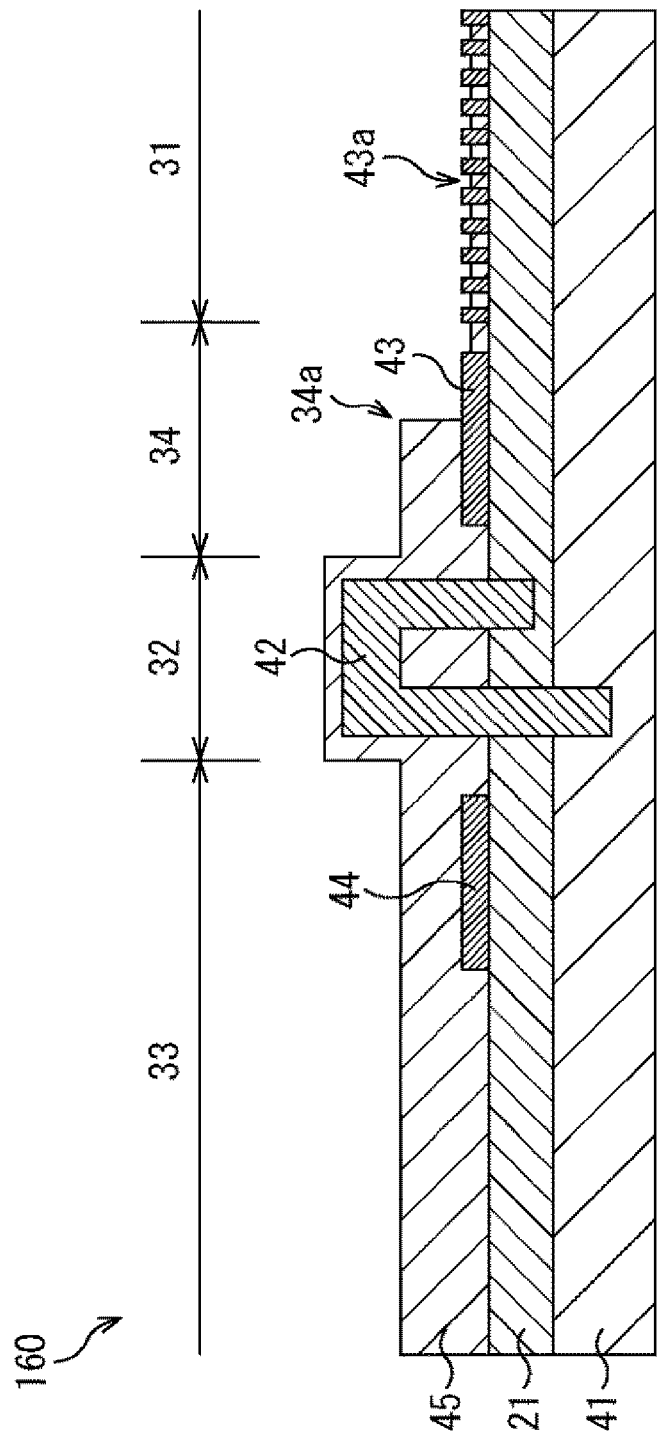
FIG. 35 is a cross-sectional view showing an example configuration of a solid-state imaging device of a fourth embodiment of the present technology.

FIG. 35 is a cross-sectional view showing an example configuration of a solid-state imaging device of a fourth embodiment of the present technology.

Note that, in the cross-sectional view of FIG. 35, parts similar to those of the cross-sectional view of FIG. 3 are indicated by the same names and the same reference characters, and will not be described, except where necessary.

In the solid-state imaging device 160 shown in FIG. 35, as in the solid-state imaging device of FIG. 1, a cross-sectional height of the insulating film 45 in the effective pixel region 31 is smaller than a cross-sectional height of the insulating film 45 in the interconnection region 32, and cross-sectional heights of the insulating film 45 in the peripheral region 33 and a region of the middle region 34 closer to the interconnection region 32 than is the step portion 34a are between the cross-sectional height of the insulating film 45 in the effective pixel region 31 and the cross-sectional height of the insulating film 45 in the interconnection region 32. Also, the cross-sectional height of the insulating film 45 in the effective pixel region 31 is smaller than a cross-sectional height of the light shield film 43 having the openings 43a corresponding to the photoelectric conversion units of the respective effective pixels.

Figure 36:
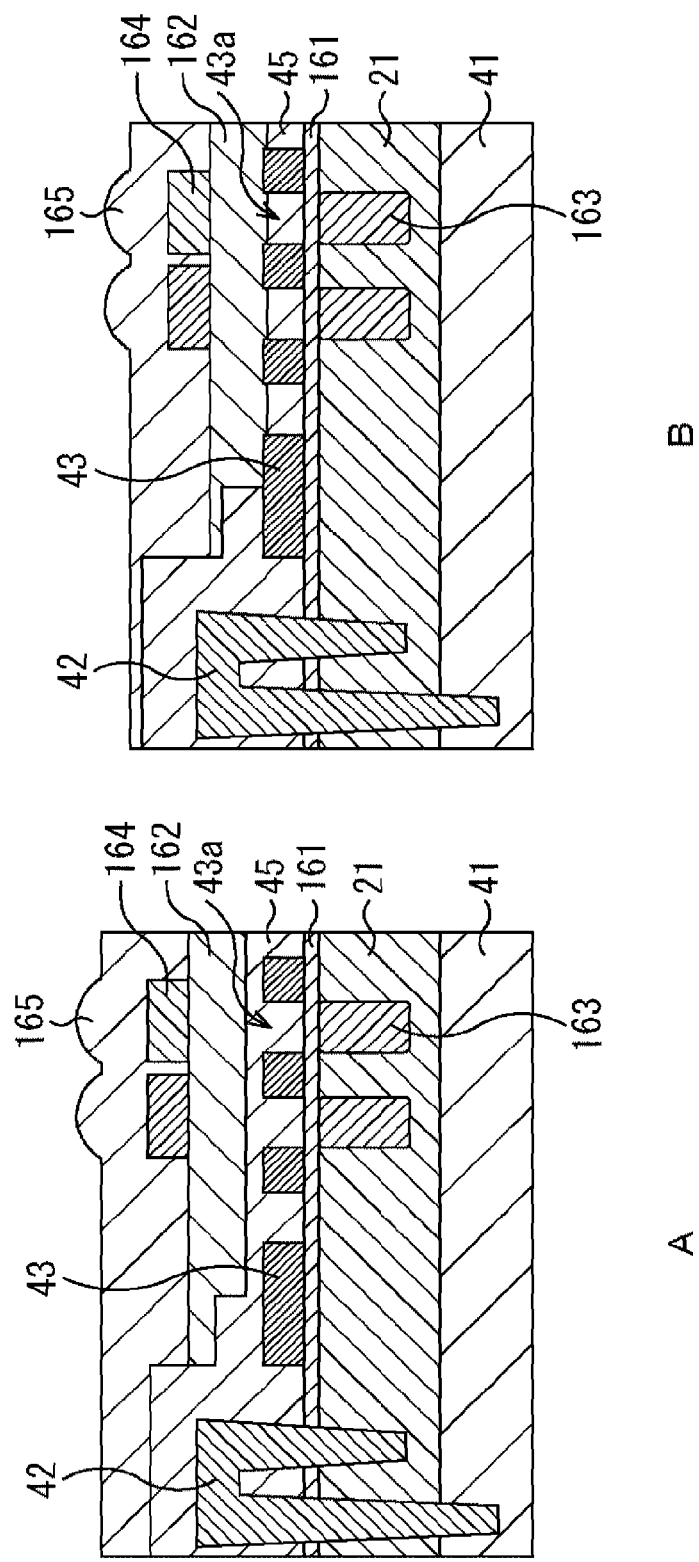
FIG. 36 is a cross-sectional view showing a detailed example configuration of a solid-state imaging device.

FIG. 36 is a diagram for comparing a cross-section of the solid-state imaging device of the first embodiment with a cross-section of the solid-state imaging device of this embodiment.

In each of the solid-state imaging device of the first embodiment shown in FIG. 36A and the solid-state imaging device of this embodiment shown in FIG. 36B, in addition to each of the configurations of FIG. 1 and FIG. 35, an anti-reflection film 161 is formed between the sensor substrate 21 and the light shield film 43, and a transparent protective film 162 is formed on the insulating film 45 in the effective pixel region 31 and the middle region 34.

Moreover, in each of FIG. 36A and FIG. 36B, a photoelectric conversion unit 163, a color filter 164, and an on-chip lens 165 are provided for each effective pixel.

Here, a thickness of the insulating film 45 in the effective pixel region 31 is smaller in the solid-state imaging device of this embodiment shown in FIG. 36B than in the solid-state imaging device of the first embodiment shown in FIG. 36A, and therefore, the sensitivity of each effective pixel can be improved. Also, a distance between the photoelectric conversion unit 163 and the color filter 164 can be reduced, and therefore, resistance to color mixture can be improved.

Note that, the insulating film 45 of this embodiment is formed as follows. In step S13 of the flowchart of FIG. 4, when an etching (dry etching) process is performed on the insulating film 45, the etching process is ended, where exposure of the light shield film 43 is detected as an end point by an end point detector (EPD).

As a result, variations in thickness of layers below the insulating film 45, or variations in etching process when exposure of the light shield film 43 is not detected as an end point by an EPD, can be accommodated, and therefore, a solid-state imaging device that does not vary from wafer to wafer can be produced.

Figure 37:
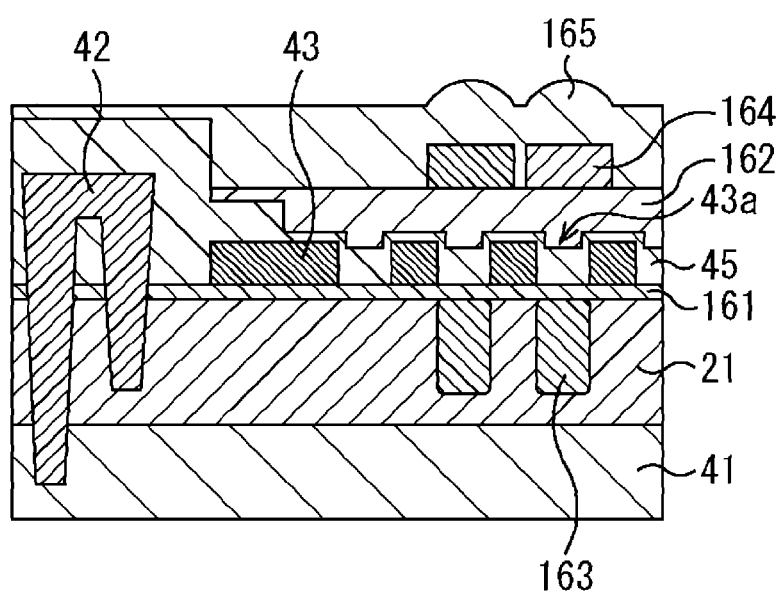
FIG. 37 is a cross-sectional view showing a variation of a solid-state imaging device.

Note that, instead of the configuration shown in FIG. 36B, the solid-state imaging device of this embodiment may, for example, have a configuration in which, as shown in FIG. 37, the insulating film 45 is formed to cover the light shield film 43 that is exposed due to the etching process.

Figure 38:
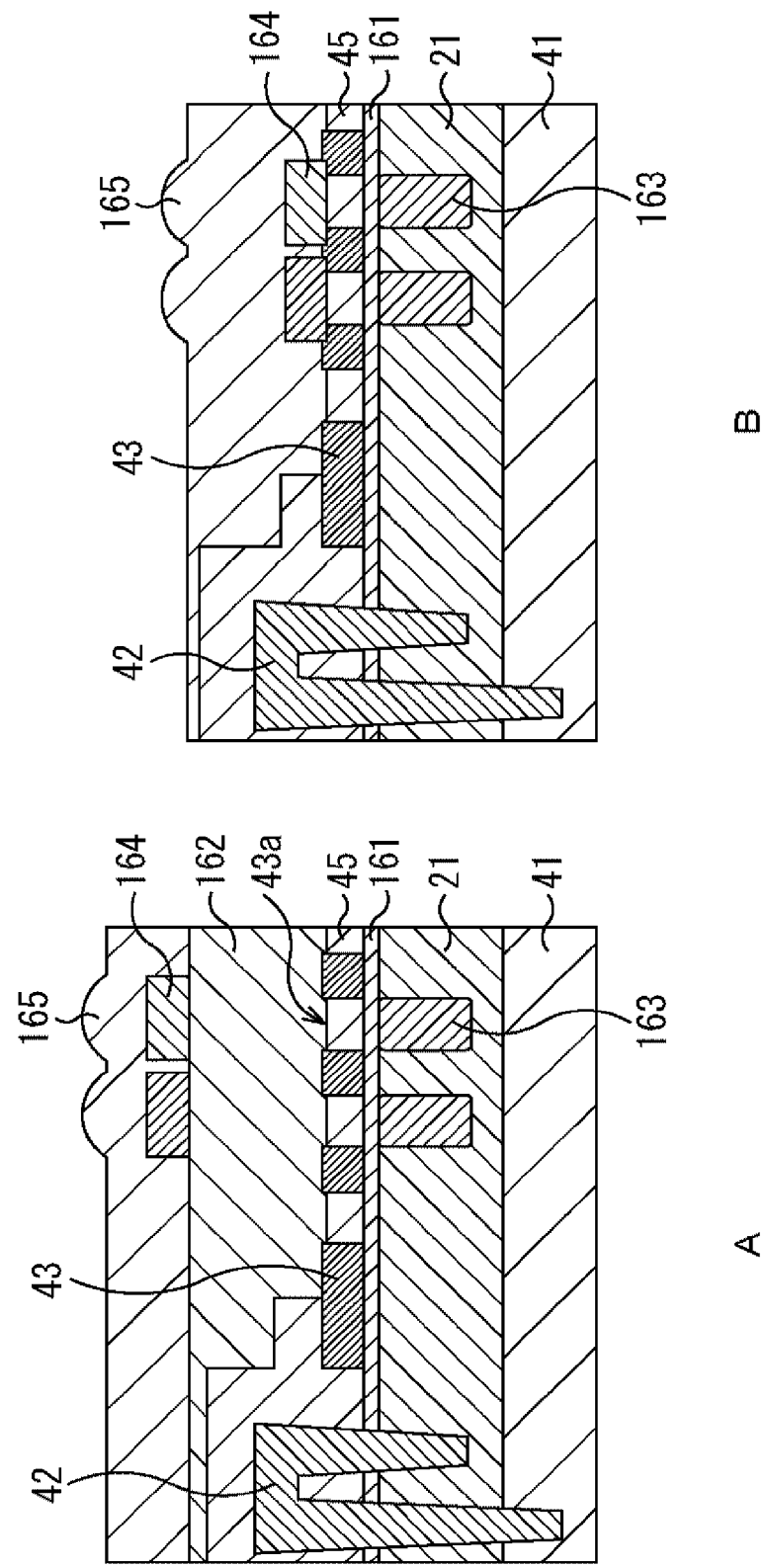
FIG. 38 is a cross-sectional view showing a variation of a solid-state imaging device.

Also, the solid-state imaging device of this embodiment may have a configuration in which, as shown in FIG. 38A, the transparent protective film 162 is formed to cover the insulating film 45 above the through-via 42 (the interconnection region 32), or a configuration in which, as shown in FIG. 38B, the transparent protective film 162 is not formed. When the transparent protective film 162 is not shown, the color filter 164 is formed on the insulating film 45 using an adhesion promoter.

Figure 39:
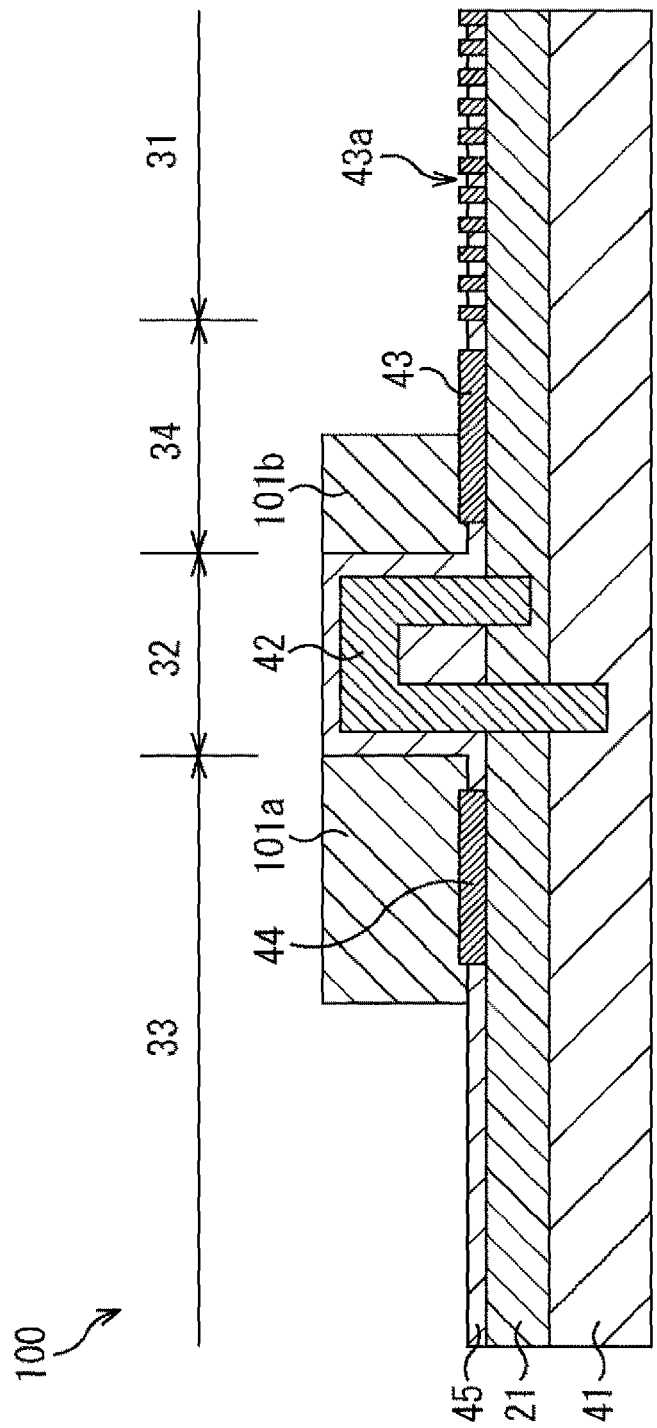
FIG. 39 is a cross-sectional view showing a variation of a solid-state imaging device.

Moreover, as shown in FIG. 39, in the solid-state imaging device 100 of the second embodiment, the cross-sectional heights of the insulating film 45 in the effective pixel region 31 and the middle region 34 may be caused to be smaller than the cross-sectional height of the light shield film 43. Note that, in this case, as shown in FIG. 39, the cross-sectional height in the peripheral region 33 may be the same as the cross-sectional heights in the effective pixel region 31 and the middle region 34, or may be greater than the cross-sectional heights in the effective pixel region 31 and the middle region 34.

Also, the solid-state imaging device of this embodiment may be applied to the solid-state imaging devices of the second to fourth embodiments.

Although, in the foregoing, a configuration in which the present technology is applied to a back-illuminated CMOS image sensor has been described, the present technology may be applied to a solid-state imaging device such as a front-illuminated CMOS image sensor or a CCD image sensor.

5. Fifth Embodiment (Example Configuration of Solid-State Imaging Device)

Figure 40:
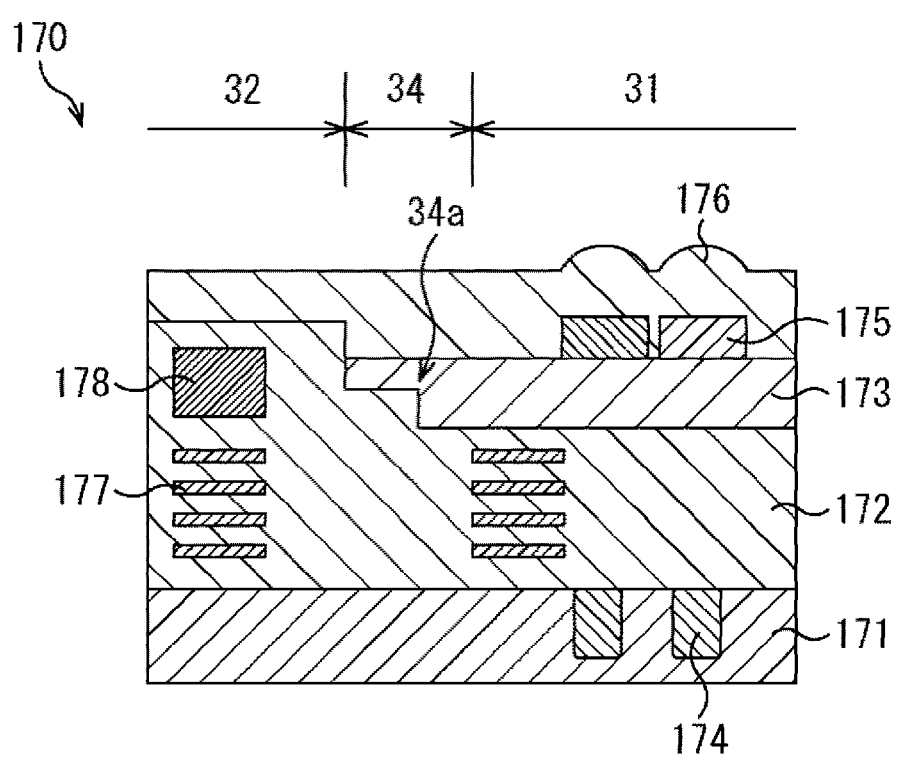
FIG. 40 is a cross-sectional view showing an example configuration of a solid-state imaging device of a fifth embodiment of the present technology.

FIG. 40 is a cross-sectional view showing an example configuration of a solid-state imaging device of a fifth embodiment of the present technology.

Note that it is assumed that the solid-state imaging device 170 shown in FIG. 40 has a plan-view configuration similar to that of the solid-state imaging device 20 shown in FIG. 2.

The solid-state imaging device 170 is configured as a so-called front-illuminated CMOS image sensor. The solid-state imaging device 170 of FIG. 40 includes a sensor substrate 171, an insulating film 172 formed on a light receiving surface of the sensor substrate 171, and a transparent protective film 173 formed on the insulating film 172.

The sensor substrate 171 includes a photoelectric conversion unit 174 for each of effective pixels two-dimensionally arranged in a matrix, in the effective pixel region 31. Also, in the effective pixel region 31, a color filter 175 and an on-chip lens 176 are formed on the transparent protective film 173 for each effective pixel.

Also, the insulating film 172 further includes Cu interconnects 177 in the effective pixel region 31 and the interconnection region 32, and Al interconnects 178 in the interconnection region 32.

The insulating film 172 is thickest in the interconnection region 32, is second thickest in a region of the middle region 34 closer to the interconnection region 32 than is the step portion 34a, and is thinnest in a region of the middle region 34 closer to the effective pixel region 31 than is the step portion 34a, and the effective pixel region 31. Specifically, also in the solid-state imaging device 170 of FIG. 40, a cross-sectional height of the insulating film 172 in the effective pixel region 31 is smaller than a cross-sectional height of the insulating film 172 in the interconnection region 32, and a cross-sectional height of the insulating film 172 in the region of the middle region 34 closer to the interconnection region 32 than is the step portion 34a is between the cross-sectional height of the insulating film 172 in the effective pixel region 31 and the cross-sectional height of the insulating film 172 in the interconnection region 32.

As a result, multiple steps are provided between the interconnection region 32 and the effective pixel region 31, and therefore, uneven application during application of an organic material, such as a CF material or the like, can be reduced, and the applied organic material can be caused to have a uniform thickness.

Figure 41:
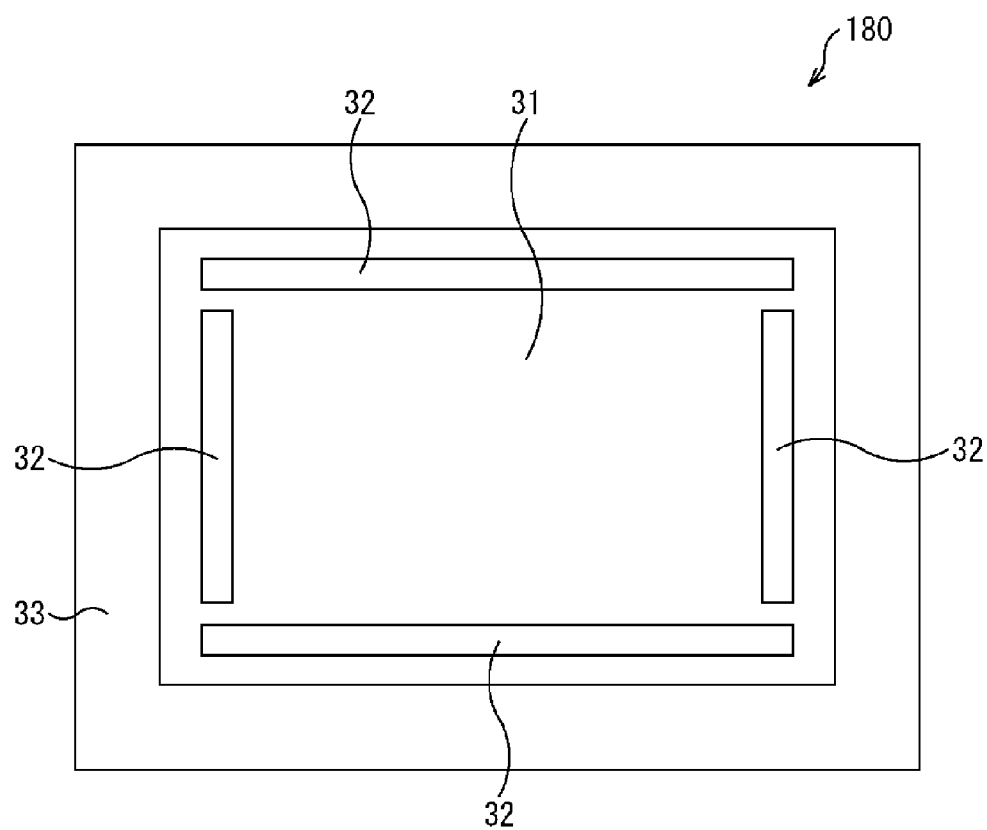
FIG. 41 is a plan view showing another example configuration of a solid-state imaging device to which the present technology is applied.

Note that the above solid-state imaging devices of the first to fifth embodiments are also applicable to the configuration in which the interconnection region 32 is provided outside the effective pixel region 31 as in the solid-state imaging device 20 shown in FIG. 2, and in addition, a configuration in which the interconnection region 32 is provided inside the effective pixel region 31 as in a solid-state imaging device 180 shown in FIG. 41.

Note that the present technology is not limited to application to a solid-state imaging device that detects a distribution of amount of visible light that enters the device to capture an image, and is also applicable to a solid-state imaging device that captures a distribution of amount of infrared light, X-rays, particles, or the like that enter the device.

Moreover, the present technology is not limited to a solid-state imaging device that successively scans unit pixels in a pixel region on a row-by-row basis to read a pixel signal from each unit pixel. The present technology is also applicable to an X-Y addressing solid-state imaging device that selects any pixel on a pixel-by-pixel basis and reads a signal from the selected pixel on a pixel-by-pixel basis. Note that the solid-state imaging device may be formed as a single chip, or may be in the form of a module having an imaging function in which a pixel unit, and a signal processing unit or an optical system, are packaged together with the solid-state imaging device.

Also, the present technology is not limited to application to a solid-state imaging device, and is also applicable to an imaging apparatus. Here, the imaging apparatus refers to a camera system, such as a digital still camera, digital camcorder, or the like, or an electronic apparatus having an imaging function, such as a mobile telephone or the like. Note that the imaging apparatus may also refer to a form of module included in an electronic apparatus, i.e., a camera module.

6. Sixth Embodiment (Example Configuration of Electronic Apparatus)

Here, an example configuration of an electronic apparatus of a sixth embodiment of the present technology will be described with reference to FIG. 42.

Figure 42:
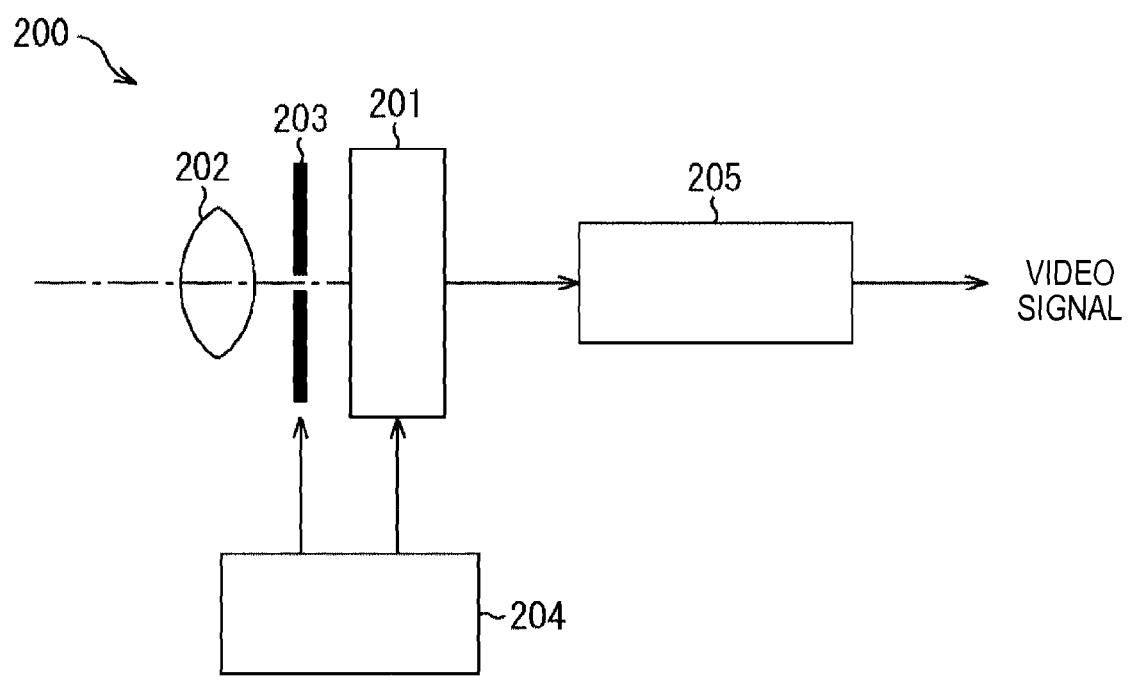
FIG. 42 is a block diagram showing an example configuration of an electronic apparatus of a sixth embodiment of the present technology.

The electronic apparatus 200 shown in FIG. 42 includes a solid-state imaging device 201 to which the present technology is applied, an optical lens 202, a shutter device 203, a drive circuit 204, and a signal processing circuit 205. FIG. 42 shows an embodiment in a case where the above solid-state imaging device 20 of the first embodiment of the present technology is provided as the solid-state imaging device 201 in the electronic apparatus (digital still camera).

The optical lens 202 brings image light (incident light) from an object to a focus on an imaging surface of the solid-state imaging device 201. As a result, signal charge is accumulated in the solid-state imaging device 201 for a predetermined period of time. The shutter device 203 controls a light illumination time and a light shield time with respect to the solid-state imaging device 201.

The drive circuit 204 supplies a drive signal for controlling a signal transfer operation of the solid-state imaging device 201 and a shutter operation of the shutter device 203. The solid-state imaging device 201 performs signal transfer according to the drive signal (timing signal) supplied from the drive circuit 204. The signal processing circuit 205 performs various signal processes on a signal output from the solid-state imaging device 201. A video signal that has been subjected to signal processing is stored in a storage medium, such as a memory or the like, or output to a monitor.

In the electronic apparatus 200 of this embodiment, uneven application can be reduced in the solid-state imaging device 201, and as a result, image quality is improved.

Note that embodiments of the present technology are not limited to the above embodiments, and various changes can be made without departing the scope or spirit of the present technology.

Additionally, the present technology may also be configured as below.

(1)

A solid-state imaging device including:

an effective pixel region of a substrate, effective pixels being arranged in the effective pixel region;

an interconnection region around the effective pixel region, electrodes or interconnects being provided in the interconnection region;

a peripheral region outside the interconnection region; and a film formed on the substrate, wherein a cross-sectional height of the film in the effective pixel region is smaller than a cross-sectional height of the film in the interconnection region, and a cross-sectional height of the film in the peripheral region and a cross-sectional height of the film in at least a portion of a middle region between the effective pixel region and the interconnection region, the portion being closer to the interconnection region, are between the cross-sectional height of the film in the effective pixel region and the cross-sectional height of the film in the interconnection region.

(2)

The solid-state imaging device according to (1), wherein a step portion of the film in the middle region is closer to the effective pixel region than a center of a width of the middle region is.

(3)

The solid-state imaging device according to (1), wherein a step portion of the film in the middle region is closer to the interconnection region than a center of a width of the middle region is.

(4)

The solid-state imaging device according to any of (1) to (3), wherein plan-view shapes of a step portion of the film in the middle region, a step portion between the middle region and the interconnection region, and/or a step portion between the interconnection region and the peripheral region have at least one corner portion having a round corner shape or a beveled shape.

(5)

The solid-state imaging device according to (1), wherein, in an adjacent region on the film adjacent to the interconnection region, formed is a height adjustment member that causes the adjacent region to have generally a same cross-sectional height as the interconnection region.

(6)

The solid-state imaging device according to (5), wherein the height adjustment member is formed in the adjacent region in the peripheral region and/or the middle region.

(7)

The solid-state imaging device according to (5) or (6), wherein when a plan-view shape of the interconnection region has at least one gap, the height adjustment member is formed to connect the gap.

(8)

The solid-state imaging device according to (5), wherein the height adjustment member causes the adjacent region to have a cross-sectional height that is generally same as or greater than or equal to the cross-sectional height of the interconnection region, and causes a region including at least the interconnection region to have a cross-sectional height greater than the cross-sectional height of the adjacent region.

(9)

The solid-state imaging device according to any of (5) to (8), wherein a plan-view shape of the height adjustment member has at least one corner portion having a round corner shape or a beveled shape.

(10)

The solid-state imaging device according to any of (1) to (8), wherein a recessed portion having a cross-sectional height smaller than the cross-sectional height of the effective pixel region is formed in a region of the film in the middle region, the region having a same cross-sectional height as the effective pixel region.

(11)

The solid-state imaging device according to (1), wherein a recessed portion having a same cross-sectional height as the effective pixel region is formed in a region of the film in the middle region, the region having a same cross-sectional height as the peripheral region.

(12)

The solid-state imaging device according to any of (1) to (10), further including:

a light shield film having an opening corresponding to a photoelectric conversion unit of each of the effective pixels in the effective pixel region, wherein the cross-sectional height of the film in the effective pixel region is smaller than a cross-sectional height of the light shield film.

(13)

A method for producing a solid-state imaging device, the solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, the method including:

a step of causing a cross-sectional height of the film in the effective pixel region to be smaller than a cross-sectional height of the film in the interconnection region, and causing a cross-sectional height of the film in the peripheral region and a cross-sectional height of the film in at least a portion of a middle region between the effective pixel region and the interconnection region, the portion being closer to the interconnection region, to be between the cross-sectional height of the film in the effective pixel region and the cross-sectional height of the film in the interconnection region, (14)

An electronic apparatus including:

a solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, wherein a cross-sectional height of the film in the effective pixel region is smaller than a cross-sectional height of the film in the interconnection region, and a cross-sectional height of the film in the peripheral region and a cross-sectional height of the film in at least a portion of a middle region between the effective pixel region and the interconnection region, the portion being closer to the interconnection region, are between the cross-sectional height of the film in the effective pixel region and the cross-sectional height of the film in the interconnection region; and a signal processing circuit that processes an output signal output from the solid-state imaging device.

(15)

A solid-state imaging device including:

an effective pixel region of a substrate, effective pixels being arranged in the effective pixel region;

an interconnection region around the effective pixel region, electrodes or interconnects being provided in the interconnection region;

a peripheral region outside the interconnection region; and a film formed on the substrate, wherein cross-sectional heights of the film in the effective pixel region and the peripheral region are smaller than a cross-sectional height of the film in the interconnection region, and wherein, in an adjacent region on the film adjacent to the interconnection region, formed is a height adjustment member that causes the adjacent region to have generally a same cross-sectional height as the interconnection region.

(16)

The solid-state imaging device according to (15), wherein the height adjustment member is formed in the adjacent region in the peripheral region and/or the effective pixel region.

(17)

The solid-state imaging device according to (15), wherein when a plan-view shape of the interconnection region has at least one gap, the height adjustment member is formed to connect the gap.

(18)

The solid-state imaging device according to (15), wherein the height adjustment member causes the adjacent region to have a cross-sectional height that is generally same as or greater than or equal to the cross-sectional height of the interconnection region, and causes a region including at least the interconnection region to have a cross-sectional height greater than the cross-sectional height of the adjacent region.

(19)

The solid-state imaging device according to any of (15) to (18), wherein a plan-view shape of the height adjustment member has at least one corner portion having a round corner shape or a beveled shape.

(20)

The solid-state imaging device according to (15), wherein a recessed portion having a cross-sectional height smaller than the cross-sectional height of the effective pixel region is formed in a middle region of the film between the effective pixel region and the interconnection region.

(21)

The solid-state imaging device according to any of (15) to (19), further including:

a light shield film having an opening corresponding to a photoelectric conversion unit of each of the effective pixels in the effective pixel region, wherein the cross-sectional height of the film in the effective pixel region is smaller than a cross-sectional height of the light shield film.

(22)

A method for producing a solid-state imaging device, the solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, the method including:

a step of causing cross-sectional heights of the film in the effective pixel region and the peripheral region to be smaller than a cross-sectional height of the film in the interconnection region; and a step of forming, in an adjacent region on the film adjacent to the interconnection region, a height adjustment member that causes the adjacent region to have generally a same cross-sectional height as the interconnection region.

(23)

An electronic apparatus including:

a solid-state imaging device including an effective pixel region of a substrate, effective pixels being arranged in the effective pixel region, an interconnection region around the effective pixel region, electrodes or interconnects being provided in the interconnection region, a peripheral region outside the interconnection region, and a film formed on the substrate, wherein cross-sectional heights of the film in the effective pixel region and the peripheral region are smaller than a cross-sectional height of the film in the interconnection region, and wherein, in an adjacent region on the film adjacent to the interconnection region, formed is a height adjustment member that causes the adjacent region to have generally a same cross-sectional height as the interconnection region; and a signal processing circuit that processes an output signal output from the solid-state imaging device.

REFERENCE SIGNS LIST 20 solid-state imaging device
21 sensor substrate
31 effective pixel region
32 interconnection region
33 peripheral region
34 middle region
34a step portion
42 through-via
45 insulating film
100 solid-state imaging device
101a, 101b, 102, 103, 111 organic member
130 solid-state imaging device
131 recessed portion
150 solid-state imaging device 151 recessed portion
160 solid-state imaging device
170 solid-state imaging device
180 solid-state imaging device

The invention claimed is:

1. A solid-state imaging device, comprising:
an effective pixel region of a substrate, wherein the effective pixel region comprises a plurality of effective pixels;
an interconnection region around the effective pixel region, wherein the interconnection region comprises at least one of electrodes or interconnects;
a peripheral region outside the interconnection region; and
a first film on the substrate, wherein the first film has:
a first cross-sectional height in the effective pixel region;
a second cross-sectional height in the interconnection region;
a third cross-sectional height in the peripheral region; and
a fourth cross-sectional height in at least one first portion of a middle region between the effective pixel region and the interconnection region, wherein the at least one first portion is closer to the interconnection region than the effective pixel region,
wherein the first cross-sectional height is smaller than the second cross-sectional height, and
wherein each of the third cross-sectional height and the fourth cross-sectional height is between the first cross-sectional height and the second cross-sectional height.

2. The solid-state imaging device according to claim 1, wherein a step portion of the first film in the middle region is closer to the effective pixel region than a center of a width of the middle region is.

3. The solid-state imaging device according to claim 1, wherein a step portion of the first film in the middle region is closer to the interconnection region than a center of a width of the middle region is.

4. The solid-state imaging device according to claim 1, wherein a shape of at least one corner portion of at least one of a first step portion of the first film in the middle region, a second step portion between the middle region and the interconnection region, or a third step portion between the interconnection region and the peripheral region is one of a round corner shape or a beveled shape.

5. The solid-state imaging device according to claim 1, wherein an adjacent region of the first film, that is adjacent to the interconnection region, comprises a height adjustment member, and
wherein a fifth cross-sectional height of the adjacent region is same as the second cross-sectional height.

6. The solid-state imaging device according to claim 5, wherein the height adjustment member is in one of the peripheral region or the middle region.

7. The solid-state imaging device according to claim 5, wherein the interconnection region has at least one gap, and
wherein the height adjustment member is in the at least one gap.

8. The solid-state imaging device according to claim 5, wherein the adjacent region is the peripheral region, wherein the fifth cross-sectional height is greater than or equal to the second cross-sectional height, and
wherein a first region including at least the interconnection region has a sixth cross-sectional height greater than the fifth cross-sectional height of the adjacent region.

9. The solid-state imaging device according to claim 5, wherein a plan-view shape of at least one corner portion of the height adjustment member has one of a round corner shape or a beveled shape.

10. The solid-state imaging device according to claim 1, wherein the middle region comprises a first region that includes a recessed portion having a fifth cross-sectional height that is smaller than the first cross-sectional height, and
wherein a sixth cross-sectional height of the first region is equal to the first cross-sectional height.

11. The solid-state imaging device according to claim 1, wherein the middle region comprises a first region that includes a recessed portion having a fifth cross-sectional height that is same as the first cross-sectional height, and
wherein the first region has a sixth cross-sectional height same as the third cross-sectional height.

12. The solid-state imaging device according to claim 1, further comprising:
a light shield film having an opening that corresponds to a photoelectric conversion unit of each of the plurality of effective pixels in the effective pixel region,
wherein the first cross-sectional height of the first film in the effective pixel region is smaller than a fifth cross-sectional height of the light shield film.

13. A method of manufacturing a solid-state imaging device, comprising:
forming an effective pixel region on a substrate, wherein the effective pixel region comprises a plurality of effective pixels;
forming an interconnection region around the effective pixel region, wherein the interconnection region comprises at least one of electrodes or interconnects;
forming a peripheral region outside the interconnection region; and
forming a film on the substrate, wherein the film has:
a first cross-sectional height in the effective pixel region;
a second cross-sectional height in the interconnection region;
a third cross-sectional height in the peripheral region; and
a fourth cross-sectional height in at least one portion of a middle region between the effective pixel region and the interconnection region, wherein the at least one portion is closer to the interconnection region than the effective pixel region,
wherein the first cross-sectional height is smaller than the second cross-sectional height, and
wherein each of the third cross-sectional height and the fourth cross-sectional height is between the first cross-sectional height and the second cross-sectional height.

14. An electronic apparatus, comprising:
a solid-state imaging device, including:
an effective pixel region of a substrate, wherein the effective pixel region comprises a plurality of effective pixels;
an interconnection region around the effective pixel region, wherein the interconnection region comprises at least one of electrodes or interconnects;

a peripheral region outside the interconnection region; and a film on the substrate, wherein the film has:
- a first cross-sectional height in the effective pixel region;
- a second cross-sectional height in the interconnection region;
- a third cross-sectional height in the peripheral region; and
- a fourth cross-sectional height in at least one portion of a middle region between the effective pixel region and the interconnection region, wherein the at least one portion is closer to the interconnection region than the effective pixel region,
- wherein the first cross-sectional height is smaller than the second cross-sectional height, and
- wherein each of the third cross-sectional height and the fourth cross-sectional height is between the first cross-sectional height and the second cross-sectional height; and a signal processing circuit configured to process a signal output from the solid-state imaging device.

15. A solid-state imaging device, comprising:

an effective pixel region of a substrate, wherein the effective pixel region comprises a plurality of effective pixels;

an interconnection region around the effective pixel region, wherein the interconnection region comprises at least one of electrodes or interconnects;

a peripheral region outside the interconnection region; and a first film on the substrate, wherein the first film has:
- a first cross-sectional height in the effective pixel region;
- a second cross-sectional height in the interconnection region;
- a third cross-sectional height in the peripheral region; and
- a fourth cross-sectional height in at least one first portion of a middle region between the effective pixel region and the interconnection region, wherein the at least one first portion is closer to the interconnection region than the effective pixel region,
- wherein each of the third cross-sectional height and the fourth cross-sectional height is between the first cross-sectional height and the second cross-sectional height,
- wherein an adjacent region of the first film, that is adjacent to the interconnection region, comprises a height adjustment member, and
- wherein a fifth cross-sectional height of the adjacent region is same as the second cross-sectional height.

16. The solid-state imaging device according to claim 15, wherein the height adjustment member is in one of the peripheral region or the effective pixel region.

17. The solid-state imaging device according to claim 15, wherein the interconnection region has at least one gap, and
wherein the height adjustment member is in the at least one gap.

18. The solid-state imaging device according to claim 15, wherein the fifth cross-sectional height is greater than or equal to the second cross-sectional height, and
wherein a first region including at least the interconnection region has a sixth cross-sectional height greater than the fifth cross-sectional height of the adjacent region.

19. The solid-state imaging device according to claim 15, wherein a plan-view shape of at least one corner portion of the height adjustment member is one of a round corner shape or a beveled shape.

20. The solid-state imaging device according to claim 15, wherein the middle region comprises a recessed portion having a sixth cross-sectional height smaller than the first cross-sectional height.

21. The solid-state imaging device according to claim 15, further comprising:
a light shield film having an opening that corresponds to a photoelectric conversion unit of each of the plurality of effective pixels in the effective pixel region,
wherein the first cross-sectional height of the first film in the effective pixel region is smaller than a sixth cross-sectional height of the light shield film.

22. A method of manufacturing a solid-state imaging device, comprising:

forming an effective pixel region on a substrate, wherein the effective pixel region comprises a plurality of effective pixels;

forming an interconnection region around the effective pixel region, wherein the interconnection region comprises at least one of electrodes or interconnects;

forming a peripheral region outside the interconnection region; and forming a film on the substrate, wherein the film has:
- a first cross-sectional height in the effective pixel region;
- a second cross-sectional height in the interconnection region;
- a third cross-sectional height in the peripheral region; and
- a fourth cross-sectional height in at least one first portion of a middle region between the effective pixel region and the interconnection region, wherein the at least one first portion is closer to the interconnection region than the effective pixel region, wherein each of the third cross-sectional height and the fourth cross-sectional height is between the first cross-sectional height and the second cross-sectional height; and forming, in an adjacent region on the film, adjacent to the interconnection region, a height adjustment member, wherein a fifth cross-sectional height of the adjacent region is same as the second cross-sectional height.

23. An electronic apparatus, comprising:
a solid-state imaging device, including:
- an effective pixel region of a substrate, wherein the effective pixel region comprises a plurality of effective pixels;
- an interconnection region around the effective pixel region, wherein the interconnection region comprises at least one of electrodes or interconnects;
- a peripheral region outside the interconnection region; and
- a film on the substrate, wherein the film has:
  - a first cross-sectional height in the effective pixel region;
  - a second cross-sectional height in the interconnection region;
  - a third cross-sectional height in the peripheral region; and
  - a fourth cross-sectional height in at least one first portion of a middle region between the effective pixel region and the interconnection region, wherein the at least one first portion is closer to the interconnection region than the effective pixel region, wherein each of the third cross-sectional height and the fourth cross-sectional height is between the first cross-sectional height and the second cross-sectional height, wherein an adjacent region of the film, that is adjacent to the interconnection region, comprises a height adjustment member, and wherein a fifth cross-sectional height of the adjacent region is same as the second cross-sectional height; and a signal processing circuit configured to process a signal output from the solid-state imaging device.

* * * * *